(12) United States Patent
Furukawa et al.

(10) Patent No.: US 10,388,217 B2
(45) Date of Patent: Aug. 20, 2019

(54) DISPLAY DEVICE AND METHOD OF DRIVING SAME

(71) Applicant: Sharp Kabushiki Kaisha, Sakai, Osaka (JP)

(72) Inventors: Hiroyuki Furukawa, Sakai (JP); Noritaka Kishi, Sakai (JP); Kazuyoshi Yoshiyama, Sakai (JP); Tamotsu Sakai, Sakai (JP); Naoko Goto, Sakai (JP); Noboru Noguchi, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 99 days.

(21) Appl. No.: 15/544,603

(22) PCT Filed: Oct. 2, 2015

(86) PCT No.: PCT/JP2015/078046
§ 371 (c)(1),
(2) Date: Jul. 19, 2017

(87) PCT Pub. No.: WO2016/117176
PCT Pub. Date: Jul. 28, 2016

(65) Prior Publication Data
US 2017/0372656 A1 Dec. 28, 2017

(30) Foreign Application Priority Data
Jan. 19, 2015 (JP) ................. 2015-007772

(51) Int. Cl.
*G09G 3/3233* (2016.01)
*G01R 19/00* (2006.01)
(Continued)

(52) U.S. Cl.
CPC ......... *G09G 3/3233* (2013.01); *G01R 19/003* (2013.01); *G09G 3/3266* (2013.01);
(Continued)

(58) Field of Classification Search
CPC .. G09G 3/3233; G09G 3/3266; G09G 3/3275; G09G 2370/08; G09G 2320/0233;
(Continued)

(56) References Cited

U.S. PATENT DOCUMENTS

2005/0195178 A1 * 9/2005 Jo .................. G09G 3/3233
345/204
2006/0158402 A1 7/2006 Nathan et al.
(Continued)

FOREIGN PATENT DOCUMENTS

| JP | 2012-150490 A | 8/2012 |
| JP | 2014-109775 A | 6/2014 |
| WO | 2014/208459 A1 | 12/2014 |

*Primary Examiner* — Mark W Regn
(74) *Attorney, Agent, or Firm* — ScienBiziP, P.C.

(57) ABSTRACT

The organic EL display device includes: a current monitoring section that measures a current flowing in a circuit element and outputs a digital measured value in accordance with the measured current; and an averaging section (36) that calculates an average value of a plurality of input values. The current monitoring section measures the current flowing in a circuit element in each pixel circuit a plurality of times in a fixed amount of time. For each pixel circuit, the averaging section (36) receives a plurality of measured values outputted from the current monitoring section in a fixed amount of time as a plurality of input values and outputs an average value of the plurality of digital measured values as a value for use in compensation computation to compensate for degradation of the circuit element.

7 Claims, 21 Drawing Sheets

(51) Int. Cl.
*G09G 3/3266* (2016.01)
*G09G 3/3275* (2016.01)
*G09G 3/3291* (2016.01)

(52) U.S. Cl.
CPC ......... *G09G 3/3275* (2013.01); *G09G 3/3291* (2013.01); *G09G 2300/0819* (2013.01); *G09G 2300/0828* (2013.01); *G09G 2300/0842* (2013.01); *G09G 2310/0262* (2013.01); *G09G 2320/0233* (2013.01); *G09G 2320/0257* (2013.01); *G09G 2320/0295* (2013.01); *G09G 2330/021* (2013.01); *G09G 2330/12* (2013.01); *G09G 2350/00* (2013.01); *G09G 2360/16* (2013.01); *G09G 2370/08* (2013.01)

(58) Field of Classification Search
CPC ......... G09G 3/3291; G09G 2310/0262; G09G 2300/0842; G09G 2360/16; G09G 2300/0819; G09G 2350/00; G09G 2320/0257; G09G 2330/021; G09G 2330/12; G09G 2300/0828; G09G 2320/0295; G01R 19/003

See application file for complete search history.

(56) References Cited

U.S. PATENT DOCUMENTS

| 2013/0100096 A1* | 4/2013 | Webster | G09G 3/3466 345/207 |
| 2014/0152642 A1* | 6/2014 | Kim | G09G 3/3233 345/212 |
| 2016/0111044 A1 | 4/2016 | Kishi et al. | |

* cited by examiner

RELATED ART

DISPLAY DEVICE AND METHOD OF DRIVING SAME

TECHNICAL FIELD

The present invention relates in general to display devices and methods of driving a display device and in particular to display devices including pixel circuits each built around an organic EL (electro luminescence) element or like electro-optical element and methods of driving such display devices.

BACKGROUND ART

Conventional display elements incorporated in display devices may be categorized into electro-optical elements having, for example, their luminance or transmittance controlled through an applied voltage and electro-optical elements having, for example, their luminance or transmittance controlled through a current flow. Typical examples of the former electro-optical elements include liquid crystal display elements, and those of the latter electro-optical elements include organic EL elements, which are also called OLEDs (organic light-emitting diodes). The organic EL display device, incorporating self light-emitting organic EL elements, more readily allows for reduced thickness, low power consumption, and higher luminance designs and enjoys other benefits than the liquid crystal display device which requires a backlight and color filters. Organic EL display devices have been actively developed in recent years for these reasons.

The organic EL display device is driven by a passive matrix method (also called a simple matrix method) or an active matrix method, both of which are well known. The organic EL display device driven by a passive matrix method has a simple structure, but difficult to increase the screen size and achieve high definition. In contrast, the organic EL display device driven by an active matrix method (hereinafter, an "active-matrix organic EL display device") is easier to increase the screen size and achieve high definition than the organic EL display device driven by a passive matrix method.

An active-matrix organic EL display device includes a matrix of pixel circuits formed therein. Each pixel circuit in the active-matrix organic EL display device typically includes an input transistor through which a pixel is selected and a drive transistor through which a current supply to the organic EL element is controlled. Note that in the following description, the current flow from the drive transistor to the organic EL element may be referred to as the "drive current."

FIG. 23 is a circuit diagram of a configuration of a conventional, typical pixel circuit 91. The pixel circuit 91 is provided at every intersection of data lines S and scan lines G in the display unit. As shown in FIG. 23, the pixel circuit 91 includes two transistors T1 and T2, a capacitor Cst, and an organic EL element OLED. The transistor T1 serves as an input transistor, and the transistor T2 serves as a drive transistor.

The transistor T1 is disposed between the data line S and the gate terminal of the transistor T2. The transistor T1 has its gate terminal connected to the scan line G and its source terminal connected to the data line S. The transistor T2 is disposed in series with the organic EL element OLED. The transistor T2 has its drain terminal connected to a power supply line that feeds a high-level power supply voltage ELVDD and its source terminal connected to the anode terminal of the organic EL element OLED. The power supply line that feeds the high-level power supply voltage ELVDD will hereinafter be referred to as the "high-level power supply line." The high-level power supply line will be denoted by the same reference sign "ELVDD" as the high-level power supply voltage. The capacitor Cst has one of its terminals connected to the gate terminal of the transistor T2 and the other terminal connected to the source terminal of the transistor T2. The cathode terminal of the organic EL element OLED is connected to a power supply line that feeds a low-level power supply voltage ELVSS. The power supply line that feeds the low-level power supply voltage ELVSS will hereinafter be referred to as the "low-level power supply line." The low-level power supply line will be denoted by the same reference sign "ELVSS" as the low-level power supply voltage. Also, in this description, the node where the gate terminal of the transistor T2, a terminal of the capacitor Cst, and the drain terminal of the transistor T1 are connected will be referred to as a "gate node" for convenience and denoted by a reference sign "VG" Usually, either the drain or the source that has a higher potential is termed the drain. In this specification, however, one of them is defined as the drain, and the other as the source; the source potential may be in some cases higher than the drain potential.

FIG. 24 is a timing chart depicting an operation of the pixel circuit 91 shown in FIG. 23. The scan line G is not selected until time t01. Therefore, until time t01, the transistor T1 is off, thereby maintaining the gate node VG at an initial potential level (e.g., a level that is in accordance with the writing in the preceding frame). At time t01, the scan line G is selected, and the transistor T1 is turned on. Accordingly, a data voltage Vdata that corresponds to the luminance of the pixel (subpixel) formed by the pixel circuit 91 is supplied to the gate node VG via the data line S and the transistor T1. Thereafter, the potential at the gate node VG changes in accordance with the data voltage Vdata in the period up to time t02. In that period, the capacitor Cst is charged to a gate-source voltage Vgs which is a difference between the potential at the gate node VG and the source potential for the transistor T2. At time t02, the scan line G is deselected. In response to this, the transistor T1 is turned off, establishing the gate-source voltage Vgs to be maintained by the capacitor Cst. The transistor T2 feeds the organic EL element OLED with a drive current that matches the gate-source voltage Vgs maintained by the capacitor Cst. As a result, the organic EL element OLED emits light at a luminance that matches the drive current.

The organic EL display device typically includes thin film transistors (TFTs) as drive transistors. However, thin film transistors tend to vary in threshold voltage from one to the other. The numerous drive transistors in the display unit, having various threshold voltages, result in variable luminance, thereby degrading display quality. In addition, the organic EL element has a current efficiency that decreases over time. More specifically, even if the organic EL element is supplied with a constant current, its luminance gradually decreases over time. This phenomenon causes image sticking. To address these issues, processes have been suggested and implemented that compensate for variations in threshold voltage of drive transistors and degradation of organic EL elements.

It is noted here that in relation to the present invention, Japanese Unexamined Patent Application Publication, Tokukai, No. 2014-109775 discloses an invention of an organic EL display device that includes, in a sensing unit (an element for extracting information on threshold voltages of drive transistors and degradation of organic EL elements), an error compensator for compensating for error components of elements, to accurately extract information in the compensation.

CITATION LIST

Patent Literature

Patent Literature 1: Japanese Unexamined Patent Application Publication, Tokukai, No. 2014-109775
Patent Literature 2: Japanese Unexamined Patent Application Publication, Tokukai, No. 2012-150490

SUMMARY OF INVENTION

Technical Problem

The above-described compensation processes typically involve measurement of a current using a current monitoring function of the organic EL display device, to detect the threshold voltages of drive transistors and current-voltage characteristics of organic EL elements. Nevertheless, because the current is extremely small, variations of elements in the current detecting circuitry and noise caused by a power supply and various signals have serious influence on current data (current measurements) obtained by the current monitoring function. Therefore, current data could include large errors. If the error-prone current data is used in current/voltage conversion and AD conversion, desirable compensation processes are not performed, which degrades display quality. The invention disclosed in Japanese Unexamined Patent Application Publication, Tokukai, No. 2014-109775 requires provision of numerous switches and capacitors in analog circuits for complicated control. Additionally, to ensure sufficient precision in such analog circuits, the manufacturing process of LSI circuits needs to be highly advanced and complex. That in turn leads to increased cost and poor practicality.

In view of these problems, the present invention has an object to provide a display device that is capable of suppressing influence of noise in detecting a current for compensation for degradation of a circuit element.

Solution to Problem

The present invention, in a first phase thereof, is directed to an active matrix display device having a function of compensating for degradation of a circuit element for displaying an image, the display device including:
a display unit including: a plurality of pixel circuits each including the circuit element, the pixel circuits forming a pixel matrix of rows and columns of pixels; scan lines each corresponding to a different one of the rows of the pixel matrix; and data lines each corresponding to a different one of the columns of the pixel matrix;
a current measuring unit configured to measure a current flowing through the circuit element to output a measured value in accordance with the measured current; and
an average value calculation unit configured to calculate an average value of a plurality of input values, wherein:
the current measuring unit measures a current flowing through the circuit element in each pixel circuit a plurality of times in a fixed amount of time; and
the average value calculation unit, for each pixel circuit, receives a plurality of measured values outputted from the current measuring unit in the fixed amount of time as the plurality of input values, to output an average value of the plurality of measured values.

The present invention, in a second phase thereof, is predicated on the first phase of the present invention and further includes a control circuit connected to an external device configured to perform compensation computation, the control circuit configured to control an operation of a scan line drive circuit that drives the scan lines and an operation of a data line drive circuit that drives the data lines, wherein the control circuit transmits, to the external device, data on the average value outputted from the average value calculation unit.

The present invention, in a third phase thereof, is predicated on the second phase of the present invention and arranged so that the control circuit transmits the data on the average value to the external device at a lower data transfer rate than the average value calculation unit outputs the data on the average value.

The present invention, in a fourth phase thereof, is predicated on the third phase of the present invention and arranged so that:
the current measuring unit measures the current flowing through the circuit element row by row of the pixel matrix; and
the control circuit includes a line memory having a plurality of ports, writes the data on the average value outputted from the average value calculation unit into the line memory, and reads out the data on the average value from the line memory at a lower rate than the data is written thereinto and simultaneously transmits the readout data on the average value to the external device.

The present invention, in a fifth phase thereof, is predicated on the first phase of the present invention and arranged so that the average value calculation unit is disposed in a data line drive circuit that drives the data lines.

The present invention, in a sixth phase thereof, is predicated on the first phase of the present invention and arranged so that the average value calculation unit is disposed in a control circuit configured to control an operation of a scan line drive circuit that drives the scan lines and an operation of a data line drive circuit that drives the data lines.

The present invention, in a seventh phase thereof, is predicated on the first phase of the present invention and arranged so that the average value calculation unit uses only those measured values which fall in a predetermined range of values, to calculate the average value.

The present invention, in an eighth phase thereof, is predicated on the first phase of the present invention and arranged so that:
the current measuring unit measures the current flowing through the circuit element sequentially from one pixel circuit to another, and
the average value calculation unit includes: (K−1) memory units for each pixel, the memory units configured to sequentially store the measured values outputted from the current measuring unit, where K is a number of times that the current measuring unit measures a current in the fixed amount of time; and an average value computation section configured to divide by K a total sum of one measured value outputted from the current measuring unit and (K−1) measured values outputted from the (K−1) memory units for each pixel.

The present invention, in a ninth phase thereof, is predicated on the first phase of the present invention and arranged so that the average value calculation unit outputs the average value of the plurality of measured values as a value to be used in compensation computation to compensate for degradation of each circuit element.

The present invention, in a tenth phase thereof, is directed to a method of driving an active matrix display device having a function of compensating for degradation of a circuit element for displaying an image, the display device including a display unit including: a plurality of pixel circuits each including the circuit element, the pixel circuits forming a pixel matrix of rows and columns of pixels; scan lines each corresponding to a different one of the rows of the pixel matrix; and data lines each corresponding to a different one of the columns of the pixel matrix, the method including:

the current measuring step of measuring a current flowing through the circuit element to output a measured value in accordance with the measured current; and the average value calculation step of calculating an average value of a plurality of input values, wherein:

in the current measuring step, a current flowing through the circuit element in each pixel circuit is measured a plurality of times in a fixed amount of time; and in the average value calculation step, for each pixel circuit, a plurality of measured values outputted in the current measuring step in the fixed amount of time serves as the plurality of input values to output an average value of the plurality of measured values.

The present invention, in an eleventh phase thereof, is predicated on the tenth phase of the present invention and arranged so that in the average value calculation step, the average value of the plurality of measured values is outputted as a value to be used in compensation computation to compensate for degradation of each circuit element.

Advantageous Effects of Invention

According to the first or ninth phase of the present invention, the display device includes a current measuring unit configured to measure a current flowing through a circuit element and an average value calculation unit configured to calculate an average value of a plurality of input values. In this configuration, the current measuring unit performs current monitoring on each pixel a plurality of times (rounds) in a fixed amount of time, and the average value calculation unit calculates an average value of measured values obtained in the plurality of rounds of current monitoring. Compensation computation can thus be performed, for example, to compensate for variations in threshold voltage of drive transistors and degradation of organic EL elements by using data on the average value of measured values obtained in the plurality of rounds of current monitoring. By virtue of LPF (low-pass filtering) effect for each pixel over time, such use of average value data improves on the conventional SN ratio of the data used in compensation computation even when the current data obtained by the current monitoring is prone to noise. In other words, when noise occurs during current monitoring, the noise has less influence on the compensation computation. Hence, the present invention, in the first or ninth phase thereof, provides a display device that is capable of suppressing influence of noise in detecting a current for compensation for degradation of a circuit element (e.g., a drive transistor or an organic EL element).

According to the second phase of the present invention, the control circuit transmits data on the average value to the external device. Therefore, the total amount of data transferred from the control circuit to the external device can be reduced.

According to the third phase of the present invention, the display device transmits data on the average value to the external device at a reduced data transfer rate. Therefore, desirable compensation computation can be performed based on results of current monitoring even when the data transfer bandwidth from the display device to the external device is narrow.

According to the fourth phase of the present invention, there is provided a line memory having a plurality of ports in the control circuit, which enables the data transfer rate from the display device to the external device to be readily reduced.

According to the fifth phase of the present invention, the amount of data transferred from the data line drive circuit to the control circuit can be reduced.

According to the sixth phase of the present invention, because the control circuit for the display device is generally a large scale integrated circuit, the average value calculation unit can be readily provided in the control circuit.

According to the seventh phase of the present invention, those values which are outside the predetermined range are not used to calculate the average value. When noise occurs during current monitoring, the influence of the noise on the compensation computation can be reliably reduced.

According to the eighth phase of the present invention, no line memory is used to calculate the average value. Therefore, the chip footprint can be reduced, which in turn can reduce the size of the display device.

According to the tenth or eleventh phase of the present invention, the invention of a method of driving a display device can achieve the same effects as the first phase of the present invention.

DESCRIPTION OF EMBODIMENTS

The following will describe embodiments of the present invention in reference to attached drawings. Throughout the following description, M and N denote an integer greater than or equal to 2, i an integer from 1 to N inclusive, and j an integer from 1 to M inclusive. Also, throughout the following description, the characteristics of a drive transistor in a pixel circuit are referred to as the "TFT characteristics," and the characteristics of an organic EL element in a pixel circuit as the "OLED characteristics."

1. First Embodiment
1.1 Overall Configuration

Figure 1:
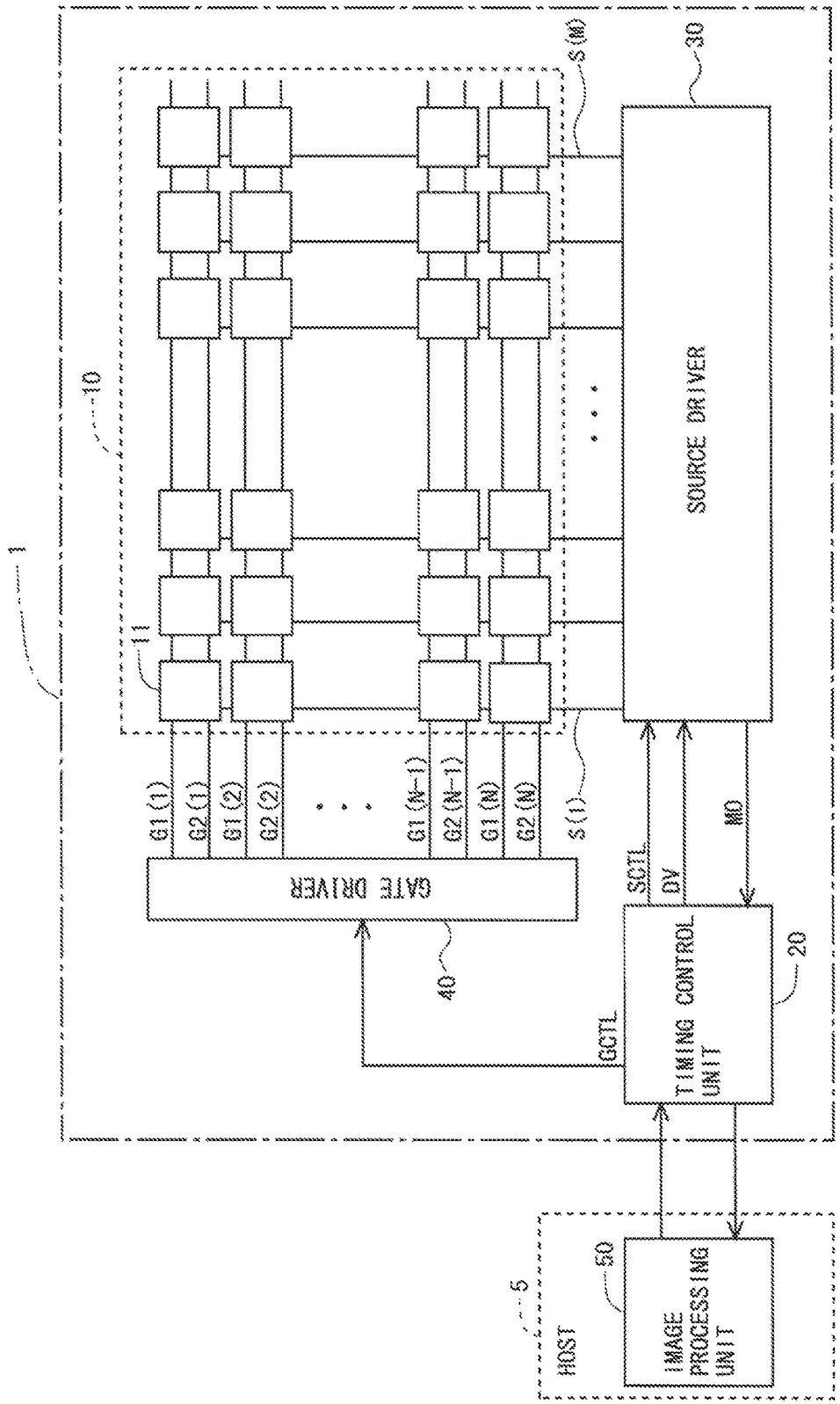
FIG. 1 is a block diagram of an overall configuration of an active-matrix organic EL display device in accordance with a first embodiment of the present invention.
Figure 2:
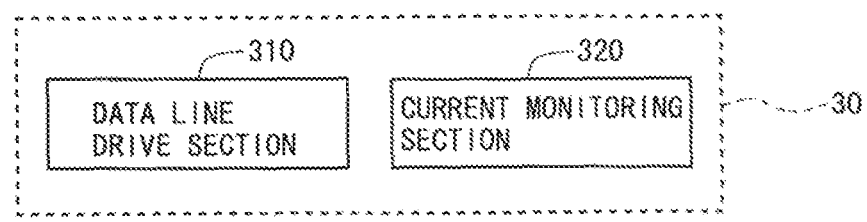
FIG. 2 is a schematic of a source driver in accordance with the first embodiment.

FIG. 1 is a block diagram of an overall configuration of an active-matrix organic EL display device 1 in accordance with a first embodiment of the present invention. The organic EL display device 1 includes a display unit 10, a timing control unit 20, a source driver 30, and a gate driver 40. The source driver 30, as shown in FIG. 2, includes a portion that functions as a data line drive section 310 and a portion that functions as a current monitoring section 320. Either one of the source driver 30 and the gate driver 40 or both may be formed integrally with the display unit 10. The organic EL display device 1 exchanges data with an image processing unit 50 in a host (e.g., a main body of a personal computer) 5.

The display unit 10 includes M data lines S(1) to S(M) and N scan lines G1(1) to G1(N) disposed at right angles. The display unit 10 further includes N monitoring control lines G2(1) to G2(N) each associated with a different one of the N scan lines G(1) to G1(N). The scan lines G1(1) to G1(N) are parallel to the monitoring control lines G2(1) to G2(N). The display unit 10 further includes N×M pixel circuits 11 at the intersections of the N scan lines G1(1) to G1(N) and the M data lines S(1) to S(M). The N×M pixel circuits 11, provided in this manner, form an N rows×M columns pixel matrix in the display unit 10. The display unit 10 further includes a high-level power supply line (not shown) to supply a high-level power supply voltage and a low-level power supply line (not shown) to supply a low-level power supply voltage.

Throughout the following description, the M data lines S(1) to S(M) will be denoted simply by a reference sign S when there is no need to distinguish between them. Likewise, the N scan lines G1(1) to G1(N) will be denoted simply by a reference sign G1 when there is no need to distinguish between them, and the N monitoring control lines G2(1) to G2(N) will be denoted simply by a reference sign G2 when there is no need to distinguish between them.

The data line S in the present embodiment is used not only as a signal line through which a luminance signal is transmitted to cause the organic EL element in the pixel circuit 11 to emit light at a desired luminance, but also as a signal line through which a voltage is delivered to the pixel circuit 11 to detect TFT and OLED characteristics (hereinafter, a "measuring voltage") and as a signal line which serves as a path for a current representing TFT and OLED characteristics that is measurable by the current monitoring section 320.

The timing control unit 20, commonly abbreviated as the "TCON," controls the operation of the source driver 30 by supplying a digital video signal DV and a source control signal SCTL to the source driver 30 and controls the operation of the gate driver 40 by supplying a gate control signal GCTL to the gate driver 40. The source control signal SCTL includes, for example, a source start pulse signal, a source clock signal, and a latch strobe signal. The gate control signal GCTL includes, for example, a gate start pulse signal, a gate clock signal, and an output enable signal. The timing control unit 20 also receives monitoring data MO outputted from the source driver 30 for transmission to the host 5 as correction data for use in compensation computation. The monitoring data MO is obtained through measurement to detect TFT and OLED characteristics.

The gate driver 40 is connected to the N scan lines G1(1) to G1(N) and the N monitoring control lines G2(1) to G2(N). The gate driver 40 is composed primarily of shift registers and logic circuits. The gate driver 40 drives the N scan lines G1(1) to G1(N) and the N monitoring control lines G2(1) to G2(N) based on the gate control signal GCTL outputted from the timing control unit 20.

The source driver 30 is connected to the M data lines S(1) to S(M). The source driver 30 selectively drives the data lines S(1) to S(M) (functioning as the data line drive section 310) and measures currents flowing through the data lines S(1) to S(M) (functioning as the current monitoring section 320).

1.2 Pixel Circuit and Source Driver

Next, the pixel circuits 11 and the source driver 30 will be described in more detail. The source driver 30, when functioning as the data line drive section 310, operates as in the following. The source driver 30 receives the source control signal SCTL outputted from the timing control unit 20 and applies voltages matched with target luminances (hereinafter, "data voltages") to the respective data lines S(1) to S(M). Triggered by a pulse on the source start pulse signal, the source driver 30 sequentially retains the digital video signal DV, which represents voltages to be applied to the data lines S, upon appearance of pulses on the source clock signal. Then, upon appearance of a pulse on the latch strobe signal, the retained digital video signal DV is converted to analog voltages. The converted analog voltages are applied simultaneously to all the data lines S(1) to S(M) as data voltages. The source driver 30, when functioning as the current monitoring section 320, applies measuring voltages to the data lines S(1) to S(M) to convert the currents that flow through the data lines S(1) to S(M) to voltages. The converted data is outputted as the monitoring data MO from the source driver 30.

Figure 3:
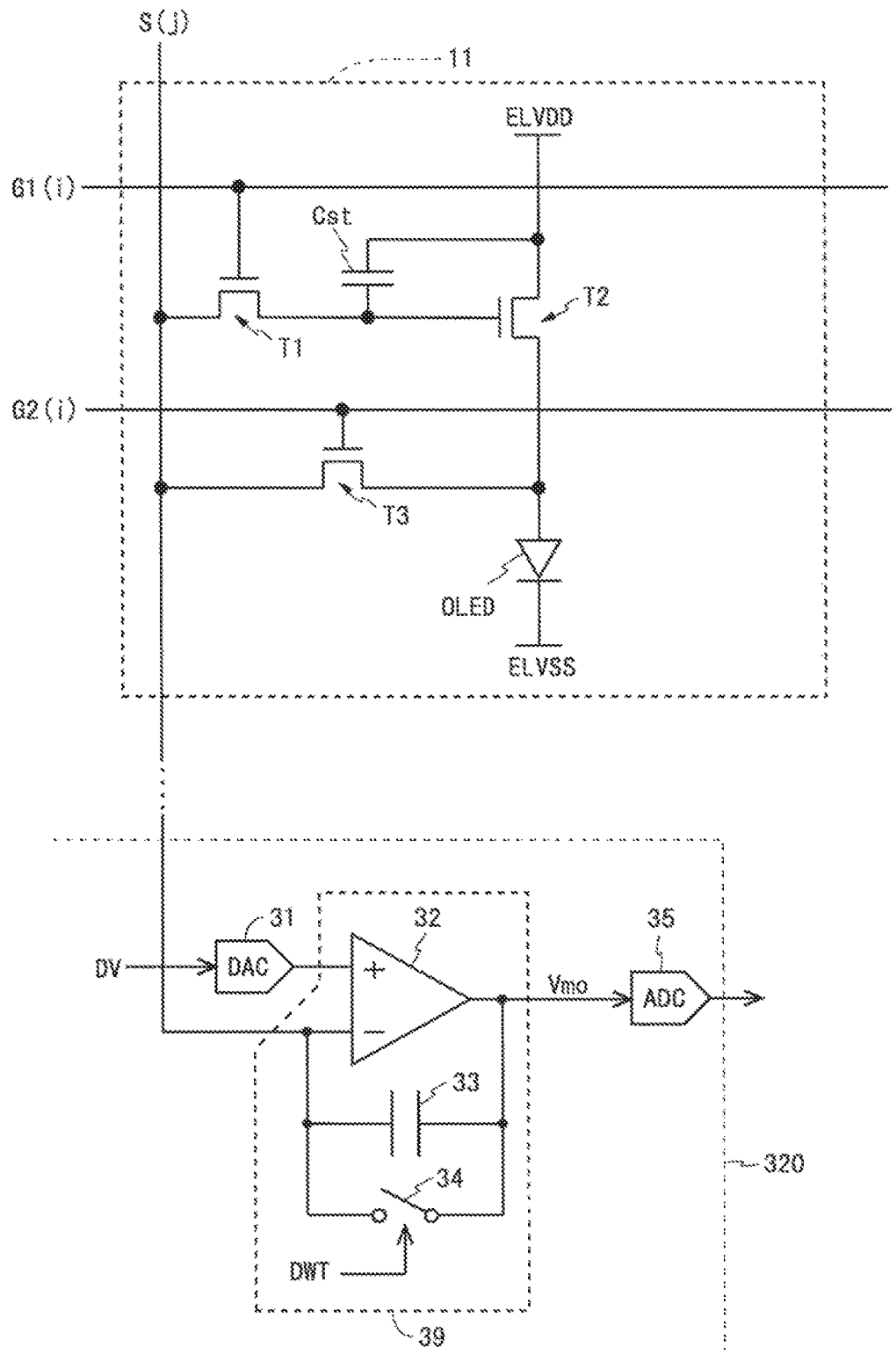
FIG. 3 is a circuit diagram of a pixel circuit and a portion of a source driver (that functions as a current monitoring section) in accordance with the first embodiment.

FIG. 3 is a circuit diagram of one of the pixel circuits 11 and a portion of the source driver 30 (that functions as the current monitoring section 320). FIG. 3 shows one of the pixel circuits 11 that is located in the i-th row, j-th column and the portion of the source driver 30 that is associated with the data line S(j) in the j-th column. The pixel circuit 11 includes an organic EL element (electro-optical element) OLED, three transistors T1 to T3, and a capacitor Cst. The transistor T1 functions as an input transistor through which a pixel is selected. The transistor T2 functions as a drive transistor through which a current supply to the organic EL element OLED is controlled. The transistor T3 functions as a monitoring control transistor through which it is controlled whether or not current measurement is to be performed to detect characteristics of the drive transistor T2 or of the organic EL element OLED.

The transistor T1 is disposed between the data line S(j) and the gate terminal of the transistor T2. The transistor T1 has its gate terminal connected to the scan line G1(*i*) and its source terminal connected to the data line S(j). The transistor T2 is disposed in series with the organic EL element OLED. The transistor T2 has its gate terminal connected to the drain terminal of the transistor T1, its drain terminal connected to a high-level power supply line ELVDD, and its source terminal connected to the anode terminal of the organic EL element OLED. The transistor T3 has its gate terminal connected to the monitoring control line G2(*i*), its drain terminal connected to the anode terminal of the organic EL element OLED, and its source terminal connected to the data line S(j). The capacitor Cst has one of its terminals connected to the gate terminal of the transistor T2 and the other terminal connected to the drain terminal of the transistor T2. The cathode terminal of the organic EL element OLED is connected to a low-level power supply line ELVSS. The transistors T1 to T3 in the pixel circuit 11 may be, for example, oxide TFTs (e.g., InGaZnO-containing TFTs) or amorphous silicon TFTs.

As shown in FIG. 3, the current monitoring section 320 includes a DA converter (DAC) 31, an operational amplifier 32, a capacitor 33, a switch 34, and an AD converter (ADC) 35. The operational amplifier 32, the capacitor 33, and the switch 34 constitute a current/voltage conversion section 39. Note that the current/voltage conversion section 39 and the DA converter 31 double as constituent elements of the data line drive section 310.

The digital video signal DV is supplied to the input terminal of the DA converter 31, which then converts the digital video signal DV to an analog voltage that serves as either a data voltage or a measuring voltage. The output terminal of the DA converter 31 is connected to the non-inverted input terminal of the operational amplifier 32. Therefore, the data voltage or the measuring voltage is supplied to the non-inverted input terminal of the operational amplifier 32. The inverted input terminal of the operational amplifier 32 is connected to the data line S(j). The switch 34 is disposed between the inverted input terminal and the output terminal of the operational amplifier 32. The capacitor 33 is disposed in parallel with the switch 34, between the inverted input terminal and the output terminal of the operational amplifier 32. The control terminal of the switch 34 is fed with an input/output control signal DWT contained in the source control signal SCTL. The output terminal of the operational amplifier 32 is connected to the input terminal of the AD converter 35.

In this configuration, when the input/output control signal DWT is HIGH, the switch 34 is on, and the inverted input terminal and the output terminal of the operational amplifier 32 are short-circuited. Under these conditions, the operational amplifier 32 functions as a buffer amplifier. Consequently, the data line S(j) is fed with the voltage that is supplied to the non-inverted input terminal of the operational amplifier 32 (data voltage or measuring voltage). When the input/output control signal DWT is LOW, the switch 34 is off, and the inverted input terminal and the output terminal of the operational amplifier 32 are connected via the capacitor 33. Under these conditions, the operational amplifier 32 and the capacitor 33 function as an integration circuit. Consequently, the output voltage (monitored voltage Vmo) of the operational amplifier 32 is matched with the current flowing in the data line S(j). The AD converter 35 converts the output voltage (monitored voltage Vmo) of the operational amplifier 32 to a digital value.

In the present embodiment, a common signal line is used to both supply a data voltage and measure a current. This is by no means intended to limit the scope of the present invention. Alternatively, separate signal lines may be provided to supply a data voltage and measure a current. Furthermore, the pixel circuit 11 may have an arrangement other than the one shown in FIG. 3. In other words, the present invention is not particularly limited by any specific circuit arrangement of, for example, the current monitoring section 320 and the pixel circuit 11.

1.3 Driving Method

Next will be described a driving method for current monitoring (measurement of currents to detect TFT and OLED characteristics). Currents may be monitored in any period including a display period, a vertical blanking period, a period immediately following a turn-on of a device, or a period immediately preceding a turn-off of a device. In the following description, the period in which a series of processes are carried out for current monitoring will be referred to as a "monitoring process period." Also in the following description, the row for which current monitoring is being performed will be referred to as the "monitored row."

Figure 4:
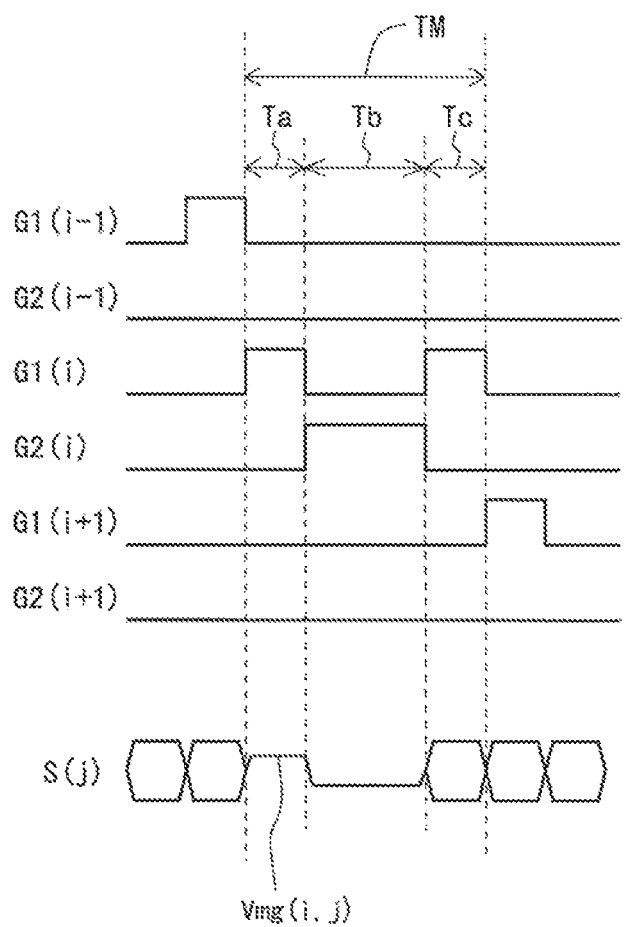
FIG. 4 is a timing chart depicting a driving method for current monitoring in accordance with the first embodiment.

FIG. 4 is a timing chart depicting a driving method for current monitoring. In FIG. 4, current monitoring is being performed on the i-th row as an example. The period denoted by a reference sign TM in FIG. 4 is a monitoring process period. The monitoring process period TM includes a period in which preparation is done to detect TFT characteristics or OLED characteristics in the monitored row (hereinafter, a "detection preparation period") Ta, a period in which currents are measured to detect the characteristics (hereinafter, a "current measurement period") Tb, and a period in which data voltages are written in the monitored row (hereinafter, a "data voltage writing period") Tc.

Throughout the detection preparation period Ta, the scan line G1(*i*) is active, and the monitoring control line G2(*i*) is inactive. Therefore, the transistor T1 is on, and the transistor T3 is off throughout that period. In the detection preparation period Ta, the data line S(j) is fed with a measuring voltage Vmg(i,j). Note that the measuring voltage Vmg(i,j) is not fixed and has different values when TFT characteristics are to be detected and when OLED characteristics are to be detected. In other words, the "measuring voltage" here comprehensively refers to a TFT characteristics measuring voltage and an OLED characteristics measuring voltage. When the measuring voltage Vmg(i,j) is a TFT characteristics measuring voltage, the transistor T2 is on; when the measuring voltage Vmg(i,j) is an OLED characteristics measuring voltage, the transistor T2 is off.

Figure 5:
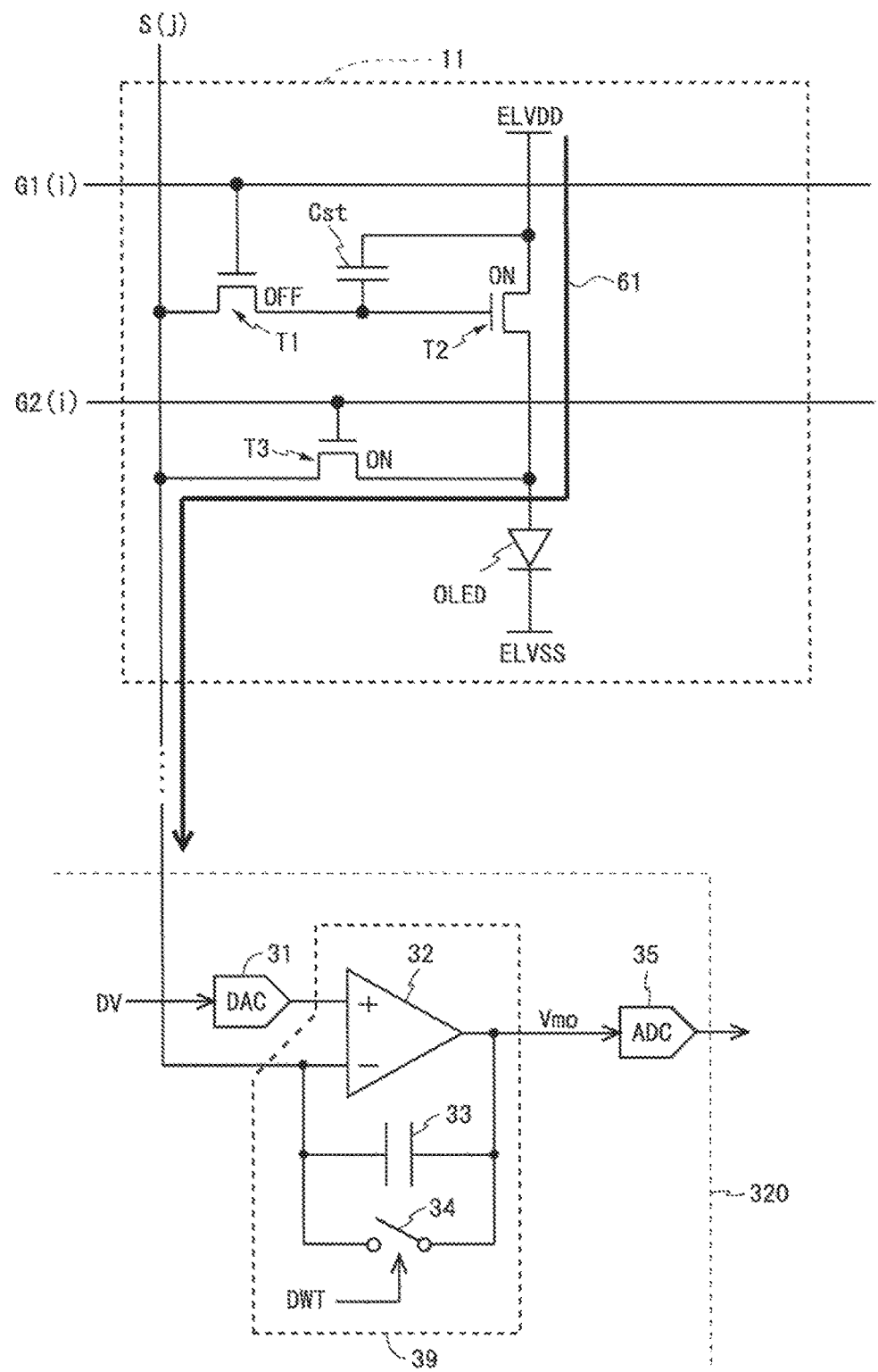
FIG. 5 is a diagram illustrating a current flow in a current measurement period in accordance with the first embodiment.
Figure 6:
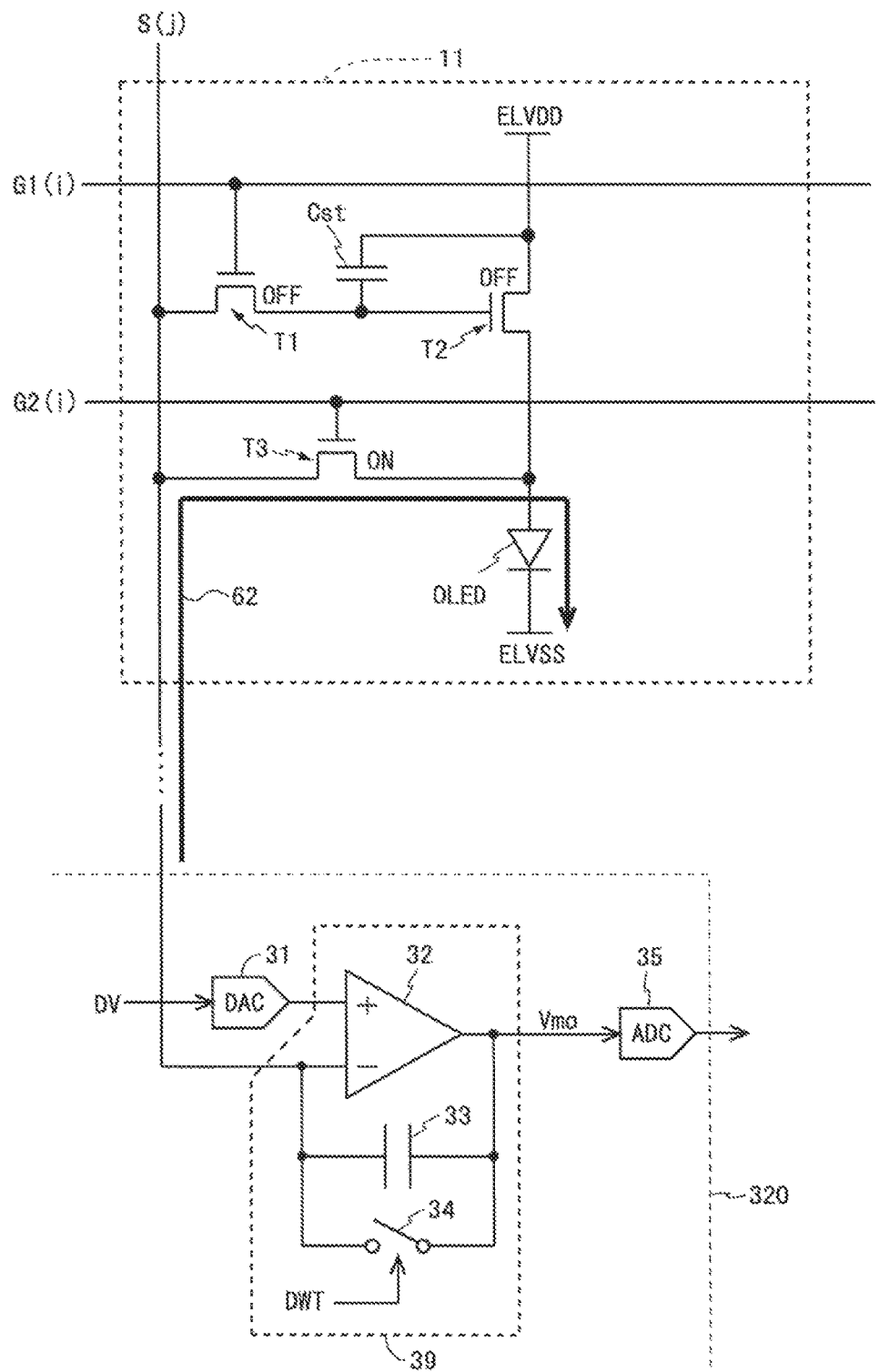
FIG. 6 is another diagram illustrating a current flow in a current measurement period in accordance with the first embodiment.

Throughout the current measurement period Tb, the scan line G1($i$) is inactive, and the monitoring control line G2($i$) is active. Therefore, the transistor T1 is off, and the transistor T3 is on throughout that period. When the measuring voltage Vmg(i,j) is a TFT characteristics measuring voltage, there is no current flow in the organic EL element OLED. Consequently, the current flowing through the transistor T2 is outputted via the transistor T3 to the data line S(j) as indicated by an arrow 61 in FIG. 5. The current flowing in the data line S(j) is measured under these conditions by the current monitoring section 320 in the source driver 30. Meanwhile, when the measuring voltage Vmg is an OLED characteristics measuring voltage, the transistor T2 is off as mentioned earlier, causing a current to flow in the organic EL element OLED. Specifically, a current flows from the data line S(j) to the organic EL element OLED via the transistor T3 as indicated by an arrow 62 in FIG. 6, causing the organic EL element OLED to emit light. The current flowing in the data line S(j) is measured under these conditions by the current monitoring section 320 in the source driver 30.

Figure 7:
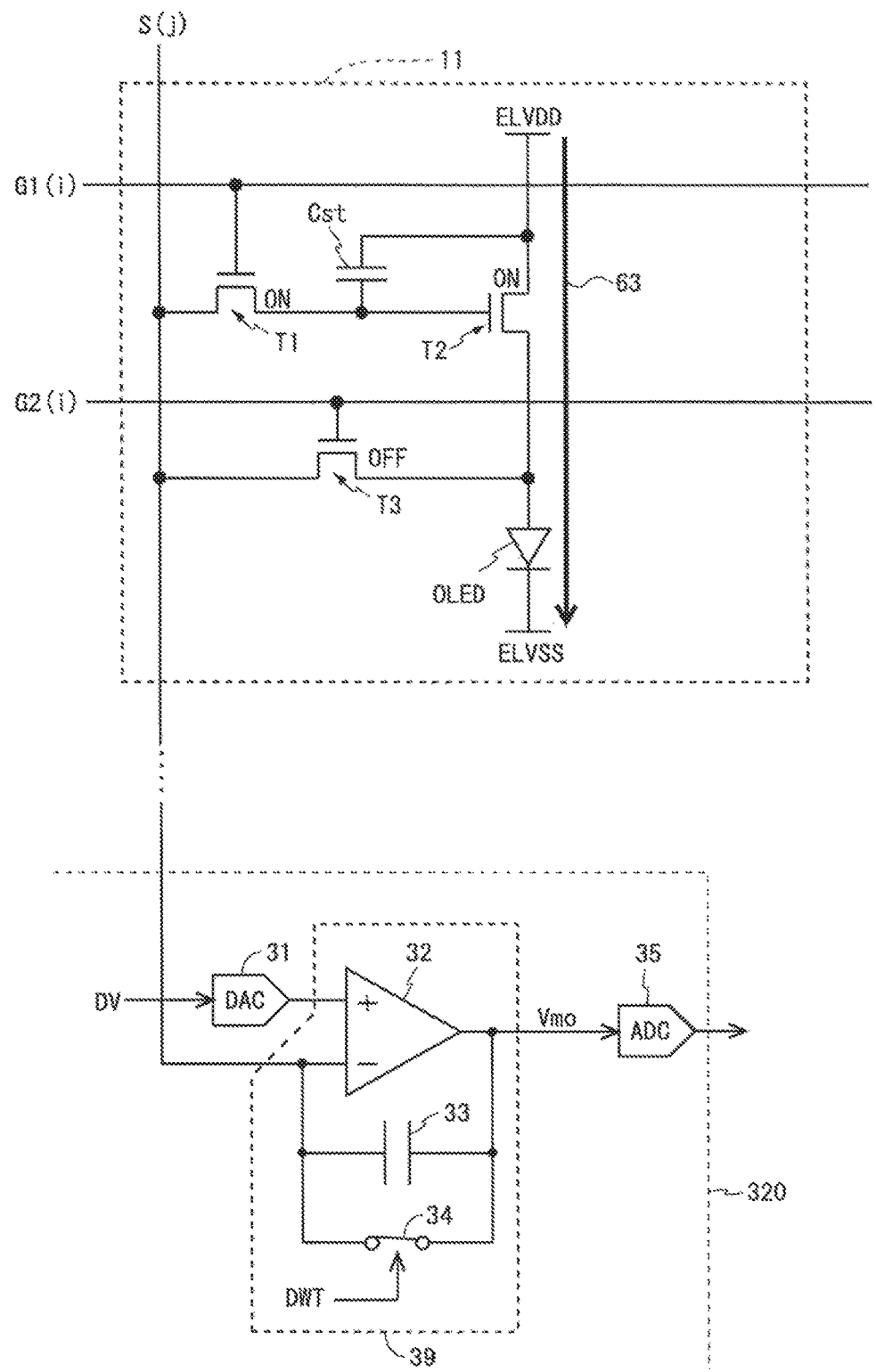
FIG. 7 is a diagram illustrating a current flow in a data voltage writing period in accordance with the first embodiment.

In the data voltage writing period Tc, the scan line G1($i$) is active, and the monitoring control line G2($i$) is inactive. Therefore, the transistor T1 is on, and the transistor T3 is off. Also, in the data voltage writing period Tc, the data line S(j) is fed with a data voltage matched with a target luminance, thereby turning on the transistor T2. As a result, a drive current is supplied to the organic EL element OLED via the transistor T2 as indicated by an arrow 63 in FIG. 7, causing the organic EL element OLED to emit light with a luminance that matches the drive current.

1.4 Averaging

In the present embodiment, current monitoring is performed on each row more than once in a fixed amount of time. For each pixel circuit 11, data on the average value of a plurality of measured values obtained in the repeated current monitoring is supplied to the host 5 as correction data DH for use in compensation computation. The following description will describe how these processes can be actually implemented.

Figure 8:
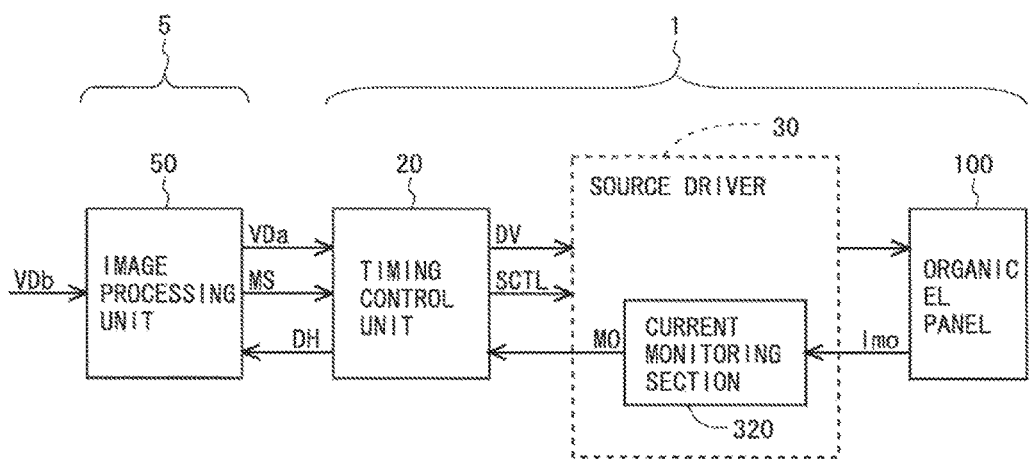
FIG. 8 is a block diagram of a configuration of a major part of an organic EL display device in accordance with the first embodiment.

FIG. 8 is a block diagram of a configuration of a major part of the organic EL display device 1 in accordance with the present embodiment. An organic EL panel 100 includes the display unit 10 and the gate driver 40. The organic EL panel 100 may in some cases further include the source driver 30. The image processing unit 50 is typically a chip called a "GPU" and in the present embodiment, makes settings as to how to perform the current monitoring and performs compensation computation using the correction data DH. Compensation computation is processes in which image data is corrected through various computations in such a manner as to compensate for variations in threshold voltage of drive transistors and degradation of organic EL elements.

Figure 9:
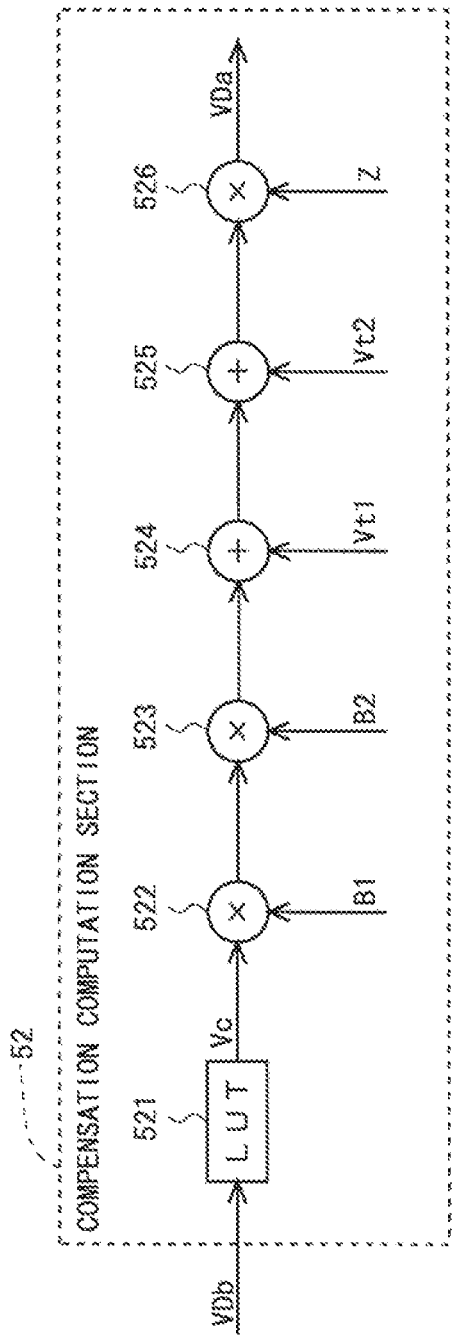
FIG. 9 is a block diagram of a configuration of a compensation computation section in accordance with the first embodiment.

Now, example compensation computation will be described in reference to FIG. 9. The image processing unit 50 includes a compensation computation section 52 which in turn includes a LUT (lookup table) 521, a multiplication section 522, a multiplication section 523, an addition section 524, an addition section 525, and a multiplication section 526. The compensation computation section 52 stores, as the correction data DH, a TFT gain value B1, an OLED degradation correction factor B2, a TFT offset value Vt1, and an OLED offset value Vt2. In this configuration, externally supplied image data (uncompensated image data) VDb is corrected as in the following. First, the uncompensated image data VDb is subjected to gamma correction in reference to the LU 521. Specifically, each gray level represented by the uncompensated image data VDb is converted to a control voltage Vc by gamma correction. The multiplication section 522 receives and multiplies the control voltage Vc by the TFT gain value B1 to output a resultant value "Vc·B1." The multiplication section 523 receives and multiplies the value "Vc·B1" outputted from the multiplication section 522 by the OLED degradation correction factor B2 to output a resultant value "Vc ·B1 ·B2." The addition section 524 receives and adds the value "Vc·B1·B2" outputted from the multiplication section 523 to the TFT offset value Vt1 to output a resultant value "Vc·B1·B2+Vt1." The addition section 525 receives and adds the value "Vc·B1·B2+Vt1" outputted from the addition section 524 to the OLED offset value Vt2 to output a resultant value "Vc·B1·B2+Vt1+Vt2." The multiplication section 526 receives and multiplies the value "Vc ·B1·B2 +Vt1+Vt2" outputted from the addition section 525 with a factor Z with which to compensate for data voltage decay attributable to parasitic capacitance in the pixel circuit 11 to output a resultant value "Z (Vc·B1·B2+ Vt1+Vt2)." Data on the value "Z (Vc·B1·B2+Vt1+Vt2)" thus derived is outputted as compensated image data VDa from the compensation computation section 52. These processes are merely an example and by no means limit the scope of the present invention.

Still referring to FIG. 8, the image processing unit 50 receives and subjects the uncompensated image data VDb to this compensation computation based on the correction data DH supplied from the timing control unit 20 to output resultant data as the compensated image data VDa. The image processing unit 50 also outputs monitoring setting information MS representing settings for current monitoring. The compensated image data VDa and the monitoring setting information MS outputted from the image processing unit 50 are supplied to the timing control unit 20 in the organic EL display device 1.

The timing control unit 20 outputs the digital video signal DV based on the compensated image data VDa and also outputs the source control signal SCTL based on the monitoring setting information MS to control the operation of the source driver 30. The timing control unit 20 also receives the monitoring data MO outputted from the source driver 30 and supplies the monitoring data MO as the correction data DH to the image processing unit 50 in the host 5.

The source driver 30 outputs the data voltage or the measuring voltage to the organic EL panel 100 based on the digital video signal DV and the source control signal SCTL. In the source driver 30, the current monitoring section 320 measures a current Imo flowing through the data line S during current monitoring (hereinafter, a "monitored current") to output the monitoring data MO based on these measured values.

Figure 10:
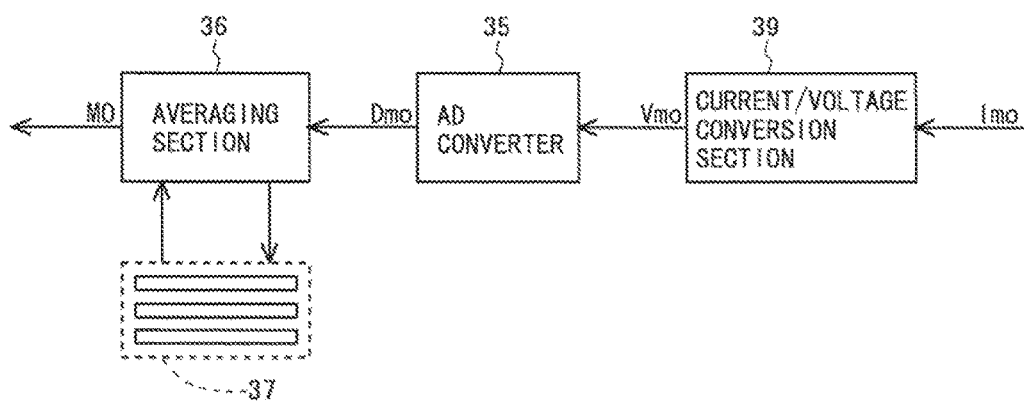
FIG. 10 is a block diagram of a functional configuration of a current monitoring section in accordance with the first embodiment.

FIG. 10 is a block diagram of a functional configuration of the current monitoring section 320 in accordance with the present embodiment. As shown in FIG. 10, the current monitoring section 320 includes the current/voltage conversion section 39, the AD converter 35, an averaging section 36, and a line memory 37. The current/voltage conversion section 39 converts the monitored current Imo to the voltage (monitored voltage) Vmo. The AD converter 35 converts this analog monitored voltage Vmo to digital measured values (measured value data) Dmo. Current monitoring is performed row by row. As mentioned earlier, in the present embodiment, current monitoring is performed on each row more than once in a fixed amount of time. Current monitoring may be performed on each row any number of times (rounds) and in the present embodiment, repeated four times (rounds).

The measured values Dmo outputted from the AD converter 35 are supplied to the averaging section 36. Every time a round of current monitoring is performed, measured values Dmo for one row are supplied to the averaging section 36. The measured values Dmo obtained in the first to third rounds of current monitoring are stored row by row in the line memory 37. The measured values Dmo obtained in the fourth round of current monitoring are supplied from the AD converter 35 to the averaging section 36. Then, for each pixel (e.g., for each pixel circuit 11) in the row on which current monitoring has been performed, the averaging section 36 adds the first- to third-round measured values Dmo stored in the line memory 37 and the fourth-round measured values Dmo supplied from the AD converter 35, to calculate an average of these values. The averaging section 36 then outputs data on the average value as the monitoring data MO. As described here, the averaging section 36 performs averaging to calculate an average value of the measured values obtained in a plurality of times (rounds) of current monitoring for each pixel.

Figure 11:
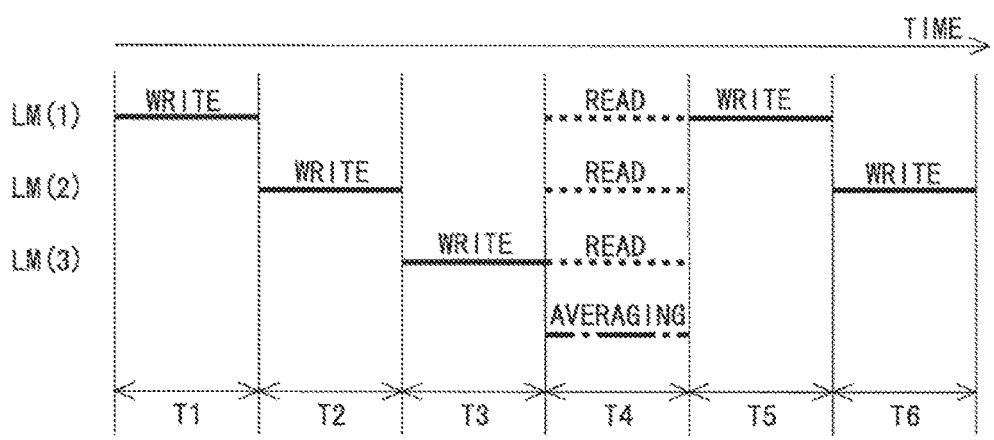
FIG. 11 is a schematic diagram of averaging in accordance with the first embodiment.

FIG. 11 is a schematic diagram of the averaging described above. In FIG. 11, the line memory 37 is divided into three parts denoted by reference signs LM(1) to LM(3), to store the first- to third-round measured values Dmo. First, in period T1, the first-round measured values Dmo are supplied to the averaging section 36 and written into a first line memory LM(1). Next, in period T2, the second-round measured values Dmo are supplied to the averaging section 36 and written into a second line memory LM(2). Then, in period T3, the third-round measured values Dmo are supplied to the averaging section 36 and written into a third line memory LM(3). Thereafter, in period T4, the fourth-round measured values Dmo are supplied to the averaging section 36, and at the same time, the averaging section 36 retrieves the first- to third-round measured values Dmo from the line memories LM(I) to LM(3), to calculate an average value of the first- to fourth-round measured values Dmo.

1.5 Data Transfer

Figure 12:
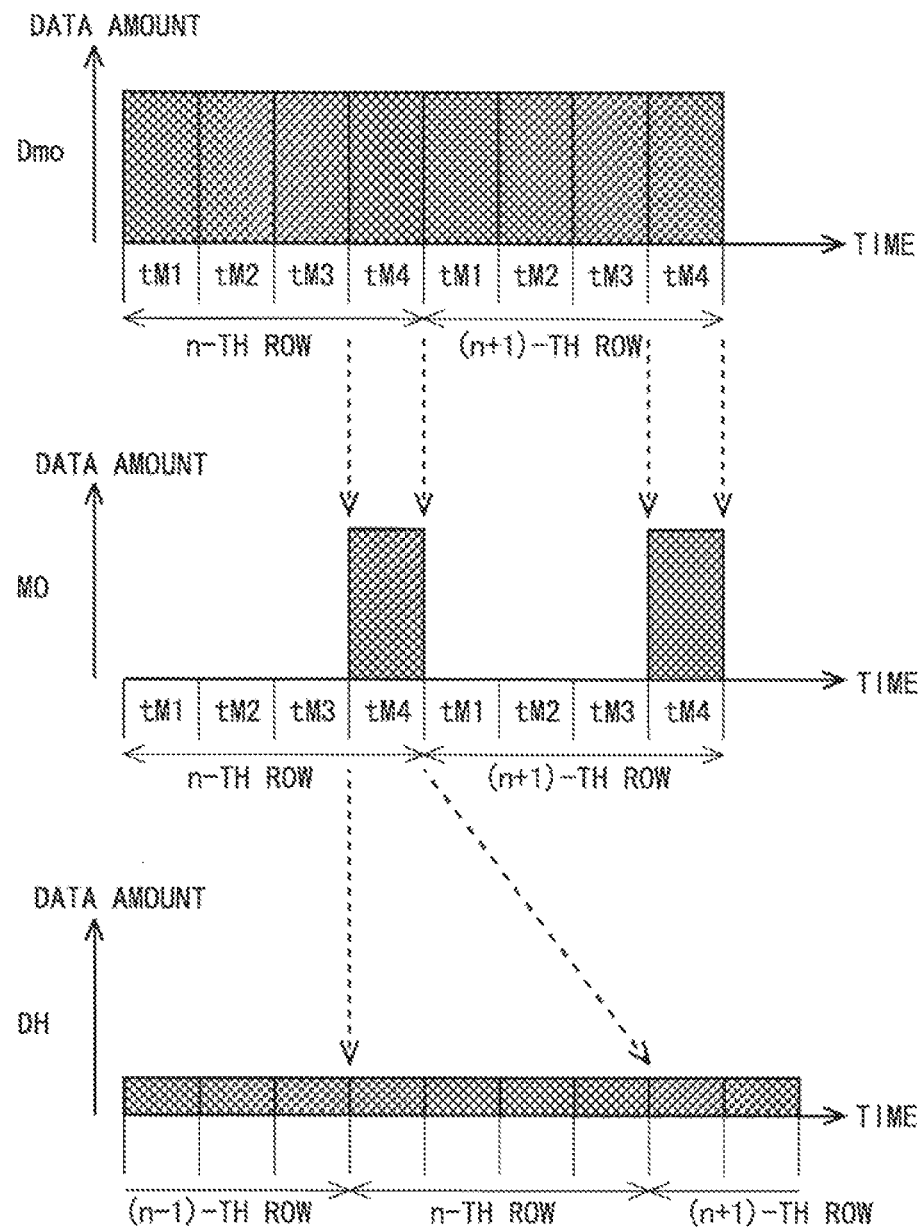
FIG. 12 is a diagram illustrating how the data obtained in current monitoring is transferred from a source driver to an image processing unit in a host in accordance with the first embodiment.

Next, referring to FIG. 12, it will be described how the data obtained in current monitoring is transferred from the source driver 30 to the image processing unit 50 in the host 5. In FIG. 12, tM1 to tM4 denote, for each row, timings at which the first- to fourth-round measured values Dmo are obtained respectively. FIG. 12 schematically shows the amount of data on the measured values (measured value data) Dmo outputted from the AD converter 35 to the averaging section 36, the amount of the monitoring data MO outputted from the averaging section 36 to the timing control unit 20, and the amount of the correction data DH outputted from the timing control unit 20 to the image processing unit 50.

The AD converter 35 sends measured values (measured value data) Dmo to the averaging section 36 every time current monitoring is performed for one row. The averaging section 36 calculates an average value of the measured values Dmo obtained in four rounds of current monitoring and outputs data on the average value as the monitoring data MO. Therefore, the averaging section 36 sends the monitoring data MO to the timing control unit 20 every time four rounds of current monitoring are performed. In other words, where a "monitoring period" is defined as a period in which a single round of current monitoring is performed, three monitoring periods in which no monitoring data MO is transferred and a monitoring period in which the monitoring data MO is transferred are alternated repeatedly. The monitoring data MO is thus transferred by burst transfer from the source driver 30 to the timing control unit 20.

The timing control unit 20 receives the monitoring data MO outputted from the averaging section 36 once every four monitoring periods. For the transfer of the monitoring data MO to the image processing unit 50, the timing control unit 20 lowers the data transfer rate. More particularly, by transferring over four monitoring periods the monitoring data MO that the timing control unit 20 receives once every four monitoring periods, the timing control unit 20 lowers the data transfer rate to one quarter that of the data transfer from the source driver 30 to the timing control unit 20. This particular process will be referred to as "time-axis expansion" in the following description.

Figure 13:
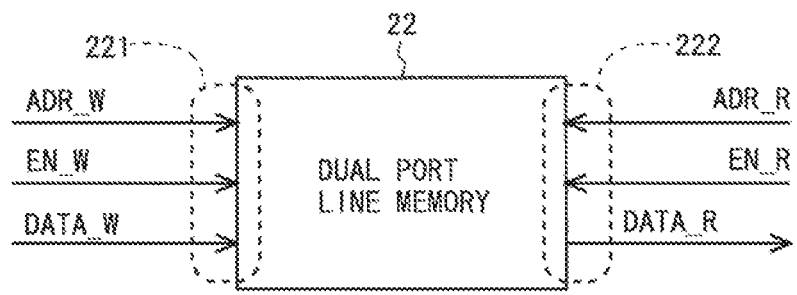
FIG. 13 is a diagram of a dual port line memory in accordance with the first embodiment.

Time-axis expansion is realized by writing data into a memory once every four monitoring periods and then reading that data over four monitoring periods. To achieve this, data needs to be written into, and read from, a memory at different rates. Accordingly, in the present embodiment, the timing control unit 20 includes a dual port line memory 22 that has two data input/output ports. FIG. 13 is a diagram of the dual port line memory 22. Through one of the ports (port 221), data DATA_W is written based on a write address signal ADR_W and a write control signal EN_W. Through the other port 222, data DATA_R is read out based on a read address signal ADR_R and a read control signal EN_R. This configuration enables data to be read from the dual port line memory 22 at a rate one quarter that at which data is written to the dual port line memory 22.

As a result of this time-axis expansion, the amount of the correction data DH outputted from the timing control unit 20 to the image processing unit 50 has a peak value one quarter that of the amount of the monitoring data MO outputted from the source driver 30 to the timing control unit 20, as could be understood from FIG. 12. In this manner, the present embodiment can lower the peak value of the amount of data transferred between the timing control unit 20 and the image processing unit 50. In the present embodiment, time-axis expansion is preceded by averaging and performed by a separate processing unit. This is however not the only possibility: the memory may be configured differently and accessed in a different sequence, and the additions may be carried out differently.

Because the image processing unit is a constituent element external to the display device (display module), data is exchanged between the image processing unit and the display device via an external connecting bus. Between the image processing unit and the display device, data is generally not exchanged in both directions: display data is only transferred in one direction from the image processing unit to the display device. The bandwidth for the data transfer from the image processing unit to the display device is growing gradually with the increasing resolution of the display device. However, data transfer from the display device to the image processing unit is only auxiliary, and the bandwidth for data transfer from the display device to the image processing unit is relatively narrow. Therefore, it is useful to lower the peak value of the amount of data transferred from the organic EL display device 1 to the image processing unit 50 as in the present embodiment in view of effective use of data transfer bandwidth.

1.6 Effects

According to the present embodiment, the current monitoring section 320 in the source driver 30 is provided with the averaging section 36 which calculates an average value of measured values obtained in a plurality of times (rounds) of current monitoring. In this configuration, current monitoring is performed four times on each row in a fixed amount of time. Thus, compensation computation is performed to compensate for variations in threshold voltage of drive transistors and degradation of organic EL elements by using data on the average value of the measured values obtained in the four rounds of current monitoring. By virtue of LPF (low-pass filtering) effect for each pixel over time, such use of average value data improves on the conventional SN ratio of the data used in compensation computation even when the current data obtained by the current monitoring is prone to noise. In other words, when noise occurs during current monitoring, the noise has less influence on the compensation computation. It should be noted here that because no spatial LPF of data over a plurality of pixels is involved, error-containing information on a pixel does not affect the compensation computation on nearby pixels. As could be understood from the description so far, the present embodiment provides the organic EL display device 1 capable of suppressing influence of noise in detecting a current for compensation for degradation of a circuit element (e.g., the drive transistor T2 or the organic EL element OLED).

Figure 14:
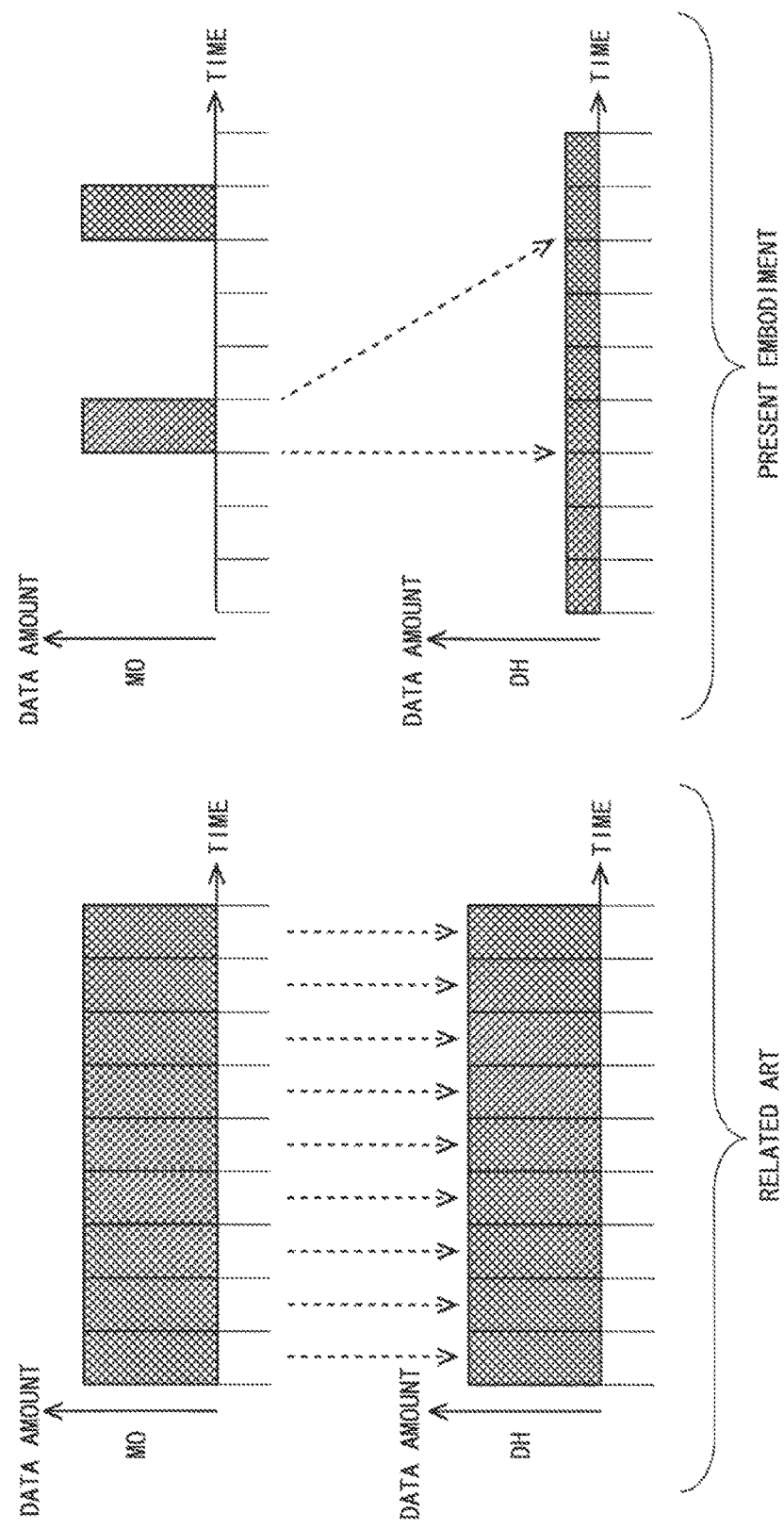
FIG. 14 is a diagram illustrating effects of the first embodiment.

In addition, since averaging is performed as described above, the present embodiment lowers the amount of the monitoring data MO transferred from the source driver 30 to the timing control unit 20 over conventional cases as could be understood from FIG. 14. Furthermore, according to the present embodiment, the timing control unit 20 includes the dual port line memory 22, and the monitoring data MO, written into the dual port line memory 22 once every four monitoring periods, is read from the dual port line memory 22 at a rate one quarter the rate at which the monitoring data MO is written to the dual port line memory 22. The total amount and peak value of data transfer from the timing control unit 20 to the host 5 can thus be lowered over conventional cases as could be understood from FIG. 14. As a consequence, desirable compensation computation can be performed based on results of current monitoring even when the data transfer bandwidth from the organic EL display device 1 to the image processing unit 50 is narrow.

1.7 Variation Examples

As mentioned earlier, the current detected in current monitoring is extremely small. Therefore, even the averaging of measured values may still fall short of sufficiently suppressing the influence of noise on the compensation computation, depending on the degree and frequency of occurrence of noise. In view of such a situation, data on the measured values outside a predetermined range may be excluded from the averaging (or replaced with data on predetermined values in the predetermined range), to use only data on those measured values which are within the predetermined range in the averaging. Only either the upper or lower limit of the predetermined range may be specified, or both the upper and lower limits may be specified.

Figure 15:
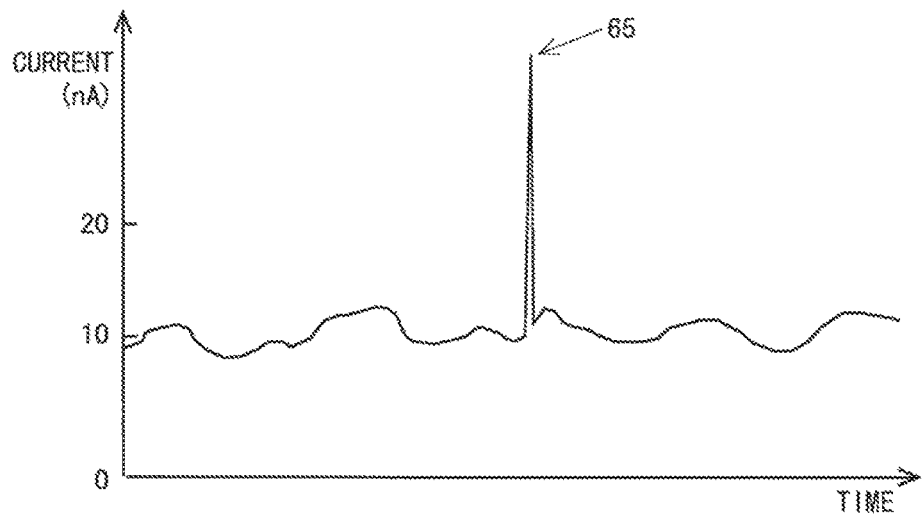
FIG. 15 is a diagram for a variation example of the first embodiment.

Suppose, as an example, that the current value has changed as shown in FIG. 15 while current values of about 10 nA are expected in current monitoring. The spike indicated by an arrow 65 would obviously be an influence of noise. If the upper limit is preset, for example, to 20 nA, the transient influence of noise can be eliminated.

2. Second Embodiment

2.1 Configuration

Now, a second embodiment of the present invention will be described. The description will focus on differences from the first embodiment above; no description will be repeated on those respects which are similar to the first embodiment. The averaging section in the first embodiment is disposed in the current monitoring section 320 in the source driver 30. In contrast, in the present embodiment, the averaging section is disposed in the timing control unit 20.

Figure 16:
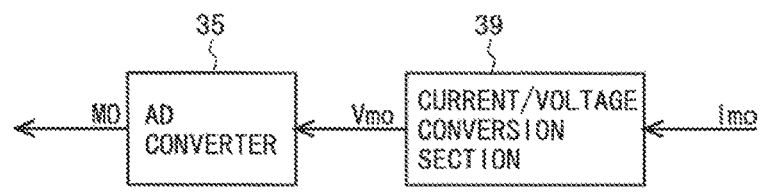
FIG. 16 is a block diagram of a functional configuration of a current monitoring section in an active-matrix organic EL display device in accordance with a second embodiment of the present invention.

FIG. 16 is a block diagram of a functional configuration of the current monitoring section 320 in accordance with the present embodiment. As shown in FIG. 16, the current monitoring section 320 includes a current/voltage conversion section 39 and an AD converter 35. The current/voltage conversion section 39 converts a monitored current Imo to a voltage (monitored voltage) Vmo. The AD converter 35 converts this analog monitored voltage Vmo to digital measured value data. Unlike the first embodiment, no averaging section is provided in the current monitoring section 320 in the present embodiment. As could be understood from this description, in the present embodiment, the measured value data outputted from the AD converter 35 is transferred as the monitoring data MO from the source driver 30 to the timing control unit 20.

Figure 17:
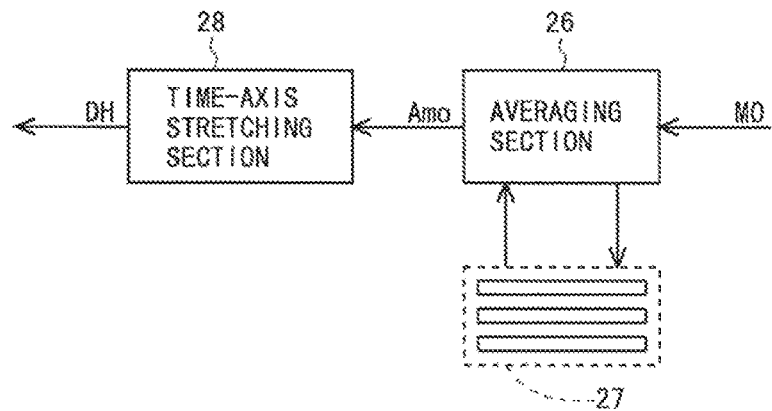
FIG. 17 is a block diagram of constituent elements of a timing control unit that are involved in transfer of data obtained in current monitoring in accordance with the second embodiment.

FIG. 17 is a block diagram of constituent elements of the timing control unit 20 that are involved in transfer of data obtained in current monitoring. As shown in FIG. 17, the timing control unit 20 includes an averaging section 26, a line memory 27, and a time-axis expansion section 28. The time-axis expansion section 28 includes the dual port line memory 22 described earlier. Current monitoring is repeated four times (rounds) on each row in the present embodiment as in the first embodiment.

The averaging section 26 is fed with the monitoring data MO outputted from the AD converter 35 in the source driver 30. Monitoring data MO for one row is supplied to the averaging section 26 every time a round of current monitoring is performed. The first- to third-round monitoring data MO is stored row by row in the line memory 27. Upon being fed with the fourth-round monitoring data MO from the AD converter 35, the averaging section 26 adds, for each pixel (for each pixel circuit 11) in the row on which current monitoring has been performed, the value of the fourth-round monitoring data MO supplied from the AD converter 35 to the sum value of the first- to third-round monitoring data MO stored in the line memory 27, to calculate an average of these values. The averaging section 26 then outputs data on the average value as averaging monitoring data Amo. As described here, averaging is similarly performed in the present embodiment to calculate an average value of the measured values obtained in a plurality of times (rounds) of current monitoring for each pixel.

The averaging monitoring data Amo outputted from the averaging section 26 is written into the dual port line memory 22 in the time-axis expansion section 28 once every four monitoring periods. The averaging monitoring data Amo is then read from the dual port line memory 22 over four monitoring periods. The data read from the dual port line memory 22 in the time-axis expansion section 28 is transferred as correction data DH from the timing control unit 20 to the image processing unit 50 in the host 5. Hence, the amount of the correction data DH outputted from the timing control unit 20 to the image processing unit 50 likewise has a peak value one quarter that of the amount of the monitoring data MO outputted from the source driver 30 to the timing control unit 20 in the present embodiment. In the present embodiment, time-axis expansion is preceded by averaging and performed by a separate processing unit. This is however not the only possibility: the memory may be configured differently and accessed in a different sequence, and the additions may be carried out differently.

2.2 Effects

According to the present embodiment, the timing control unit 20 is provided with the averaging section 26 which calculates an average value of measured values obtained in a plurality of times (rounds) of current monitoring. In this configuration, current monitoring is performed four times on each row in a fixed amount of time. Thus, compensation computation is performed to compensate for variations in threshold voltage of drive transistors and degradation of organic EL elements by using data on the average value of the measured values obtained in the four rounds of current monitoring. Therefore, similarly to the first embodiment, the present embodiment provides the organic EL display device 1 capable of suppressing influence of noise in detecting a current for compensation for degradation of a circuit element (e.g., the drive transistor T2 or the organic EL element OLED).

Figure 18:
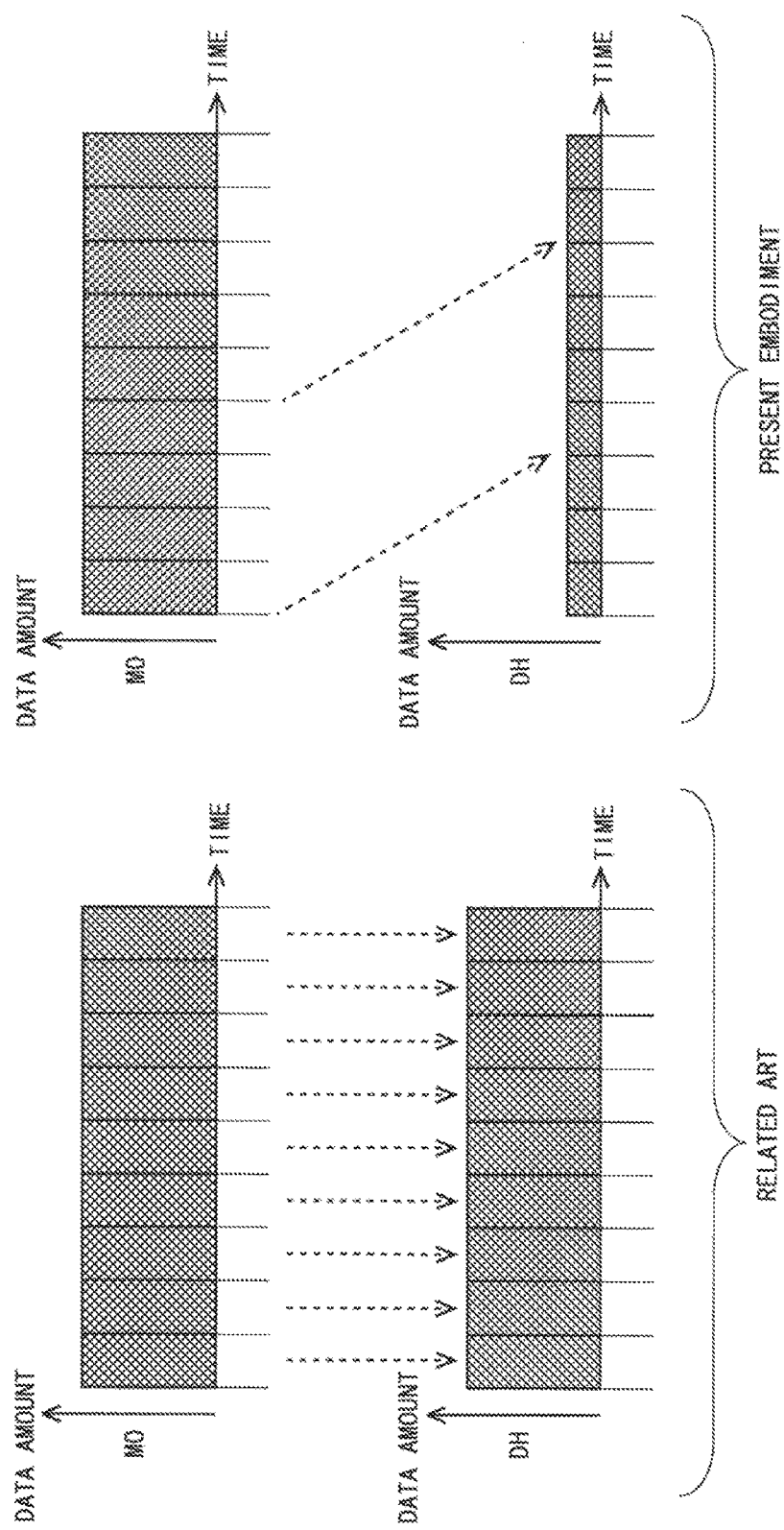
FIG. 18 is a diagram illustrating effects of the second embodiment.

In addition, according to the present embodiment, the timing control unit 20 includes the time-axis expansion section 28 which in turn includes the dual port line memory 22, and the averaging monitoring data Amo, written into the dual port line memory 22 once every four monitoring periods, is read from the dual port line memory 22 at a rate one quarter the rate at which the averaging monitoring data Amo is written to the dual port line memory 22. As described so far, the total amount and peak value of data transfer from the timing control unit 20 to the host 5 can be lowered over conventional cases as could be understood from FIG. 18. As a consequence, desirable compensation computation can be performed based on results of current monitoring even when the data transfer bandwidth from the organic EL display device 1 to the image processing unit 50 is narrow, similarly to the first embodiment.

3. Third Embodiment 3.1 Configuration

A third embodiment of the present invention will be described. The description will focus on differences from the first embodiment above; no description will be repeated on those respects which are similar to the first embodiment. Current monitoring is performed row by row in the first embodiment. This is why the line memory 37 is used in averaging. In contrast, in the present embodiment, current monitoring is performed sequentially from one pixel (pixel circuit) to another. In other words, current monitoring is repeated a plurality of times sequentially from one pixel to another. Flip-flops that serve as a memory unit for each pixel are used for this purpose in averaging. Current monitoring may be performed on each pixel any number of times (rounds) and in the present embodiment, repeated four times (rounds).

Figure 19:
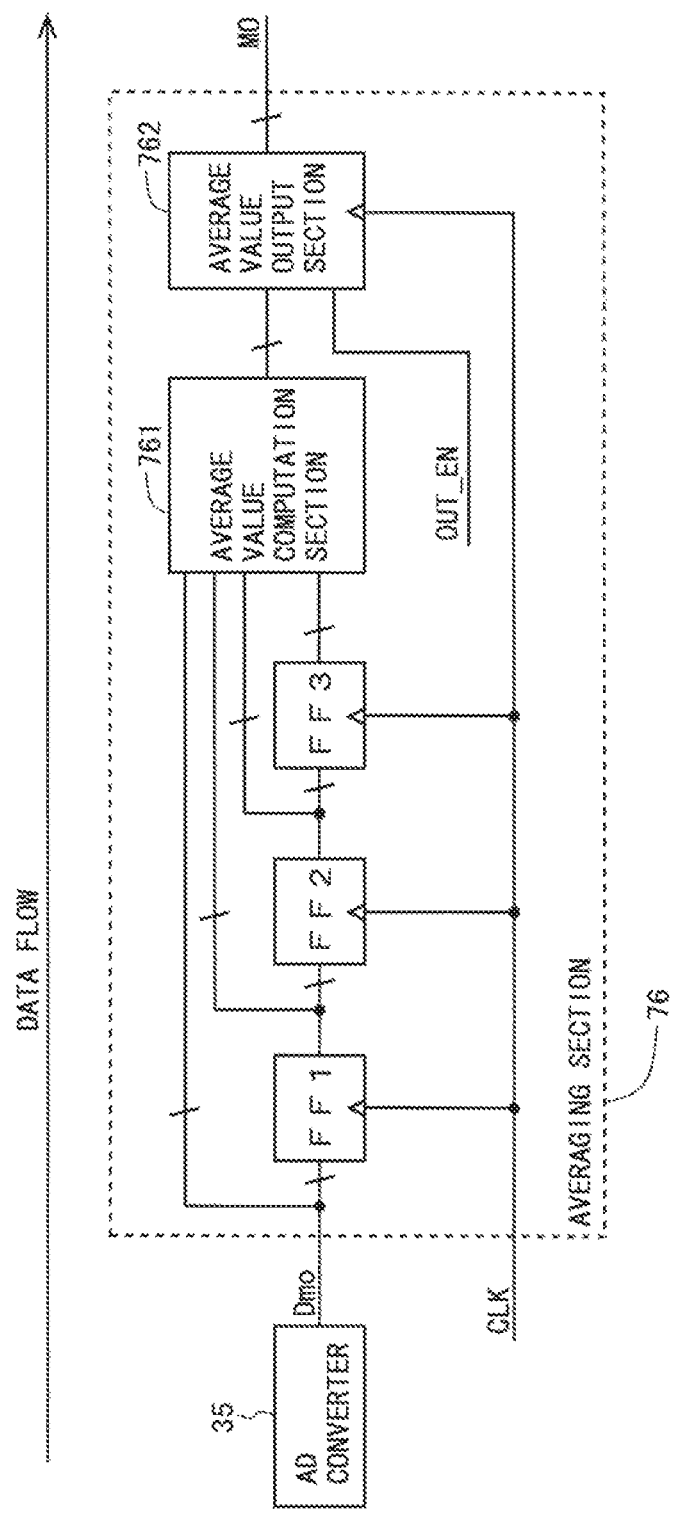
FIG. 19 is a diagram of a configuration of an averaging section in an active-matrix organic EL display device in accordance with a third embodiment of the present invention.

FIG. 19 is a diagram of a configuration of an averaging section 76 in accordance with the present embodiment. As shown in FIG. 19, the averaging section 76 includes three flip-flops FF1 to FF3 connected in series, an average value computation section 761, and an average value output section 762. If current monitoring is repeated K times on each pixel, there are provided (K−1) flip-flops.

Figure 20:
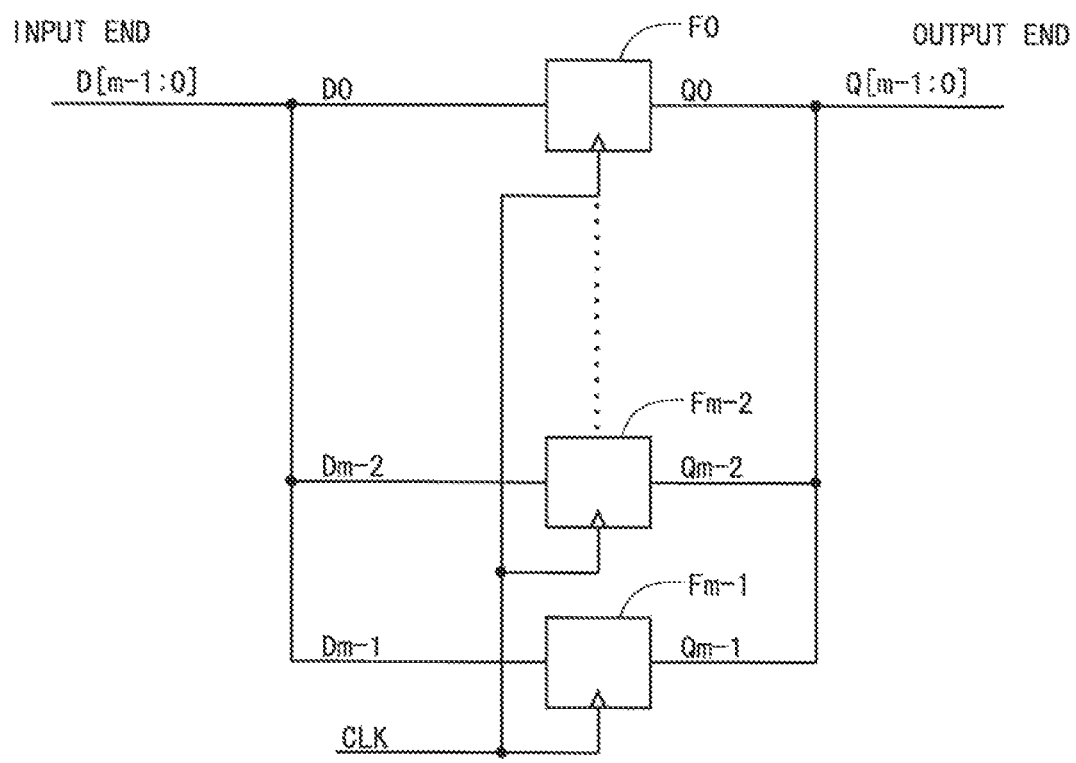
FIG. 20 is a diagram of a specific configuration of a flip-flop in the averaging section in accordance with the third embodiment.

Each flip-flop FF1 to FF3 is configured as shown in FIG. 20. Assume in this embodiment that the measured value Dmo outputted from the AD converter 35 is m bits. As could be understood from FIG. 20, each flip-flop FF1 to FF3 includes m flip-flops F0 to F$m-1$ connected in parallel. The flip-flops F0 to F$m-1$, as clocked by a clock CLK, respectively latches input data D0 to D$m-1$ to output the data D0 to D$m-1$ as output data Q0 to Q$m-1$. Each constituent element shown in FIG. 19 will be described. The flip-flops FF1 to FF3, as clocked by the clock CLK, respectively latch incoming data on the measured value Dmo to output that data. More specifically, the flip-flop FF1 latches the data outputted from the AD converter 35, the flip-flop FF2 latches the data outputted from the flip-flop FF1, and the flip-flop FF3 latches the data outputted from the flip-flop FF2.

The average value computation section 761 calculates the total sum of the single measured value Dmo outputted from the AD converter 35 and the measured values Dmo outputted from the flip-flops FF1 to FF3 and divides the total sum by 4, which is the number of times that current monitoring is repeated on each pixel. The average value of measured values obtained in the plurality of rounds of current monitoring is obtained for each pixel in this manner. If the measured value Dmo outputted from the AD converter 35 is m bits, the average value computation section 761 is fed with four sets of m-bit data, and the total sum is 4 m bits. Because the total sum is divided by 4, the data on the average value is m bits.

The average value output section 762 outputs the data on the average value calculated by the average value computation section 761 as the monitoring data MO in accordance with the clock CLK and an output enable signal OUT_EN. The monitoring data MO outputted from the average value output section 762 is supplied to the timing control unit 20 (see FIG. 1).

The present embodiment assumes that the averaging section 76 is provided in the source driver 30 as in the first embodiment. The configuration shown in FIG. 19 would be still applicable when the averaging section 76 was provided in the timing control unit 20 as in the second embodiment.

3.2 Operation of Averaging Section

Figure 21:
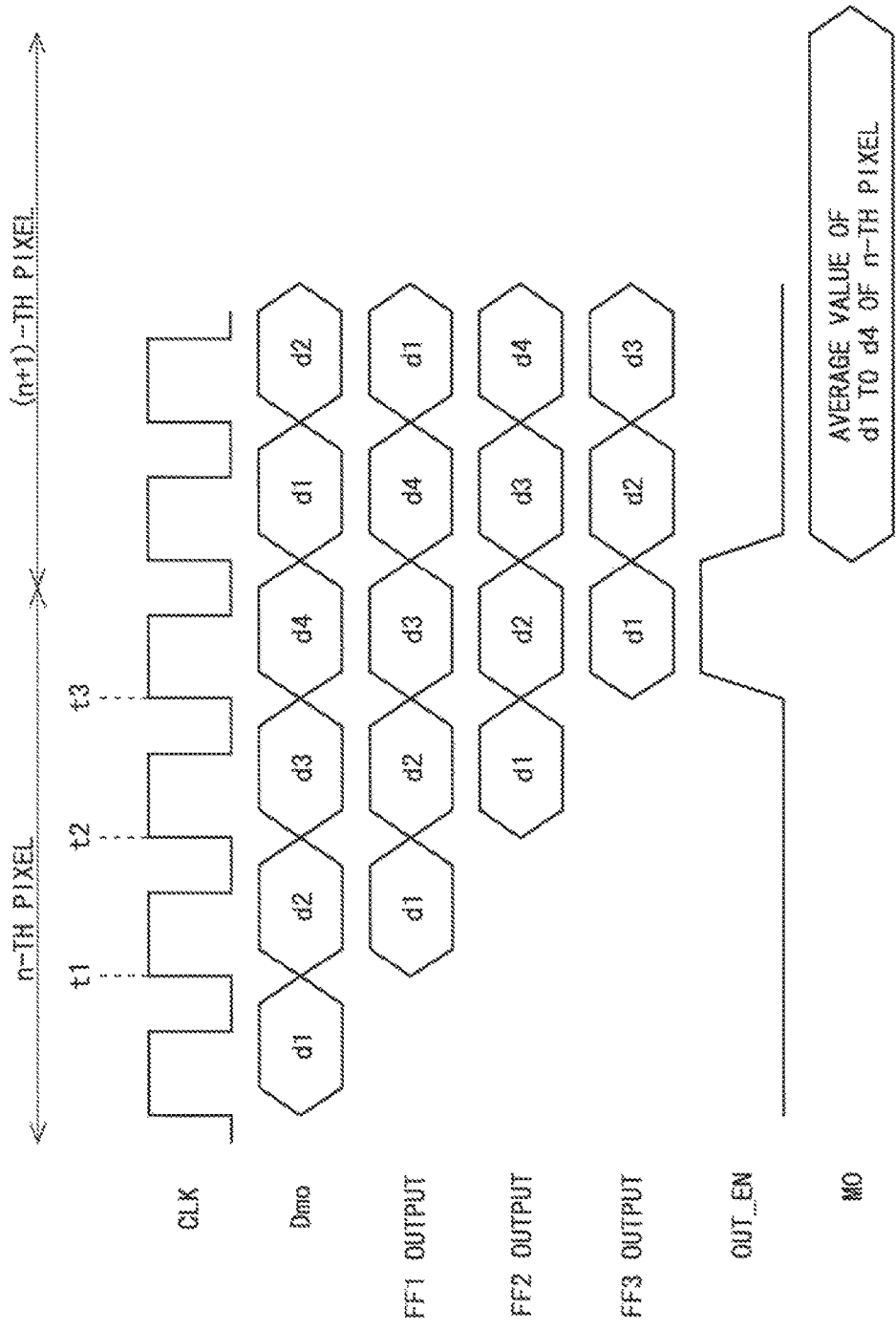
FIG. 21 is a timing chart depicting an operation of the averaging section in accordance with the third embodiment.

Next, an operation of the averaging section 76 in accordance with the present embodiment will be described in reference to FIGS. 19 and 21. FIG. 21 is a timing chart depicting an operation of the averaging section 76 in accordance with the present embodiment. In FIG. 21, the first- to fourth-round measured values Dmo for each pixel are denoted respectively by d1 to d4.

The first- to fourth-round measured values (measured value data) Dmo are outputted sequentially from the AD converter 35. At time t1, the clock CLK rises, and the flip-flop FF1 outputs the first measured value d1. At time t2, the clock CLK rises, the flip-flop FF2 outputs the first measured value d1, and the flip-flop FF1 outputs the second measured value d2. At time t3, the clock CLK rises, the flip-flop FF3 outputs the first measured value d1, the flip-flop FF2 outputs the second measured value d2, and the flip-flop FF1 outputs the third measured value d3. Also at time t3, the AD converter 35 outputs the fourth measured value d4. In this manner, the average value computation section 761 is fed with the first- to fourth-round measured values Dmo (d1 to d4) and calculates an average value of the measured values Dmo (d1 to d4). Data on the average value calculated by the average value computation section 761 is supplied to the average value output section 762. The output enable signal OUT_EN rises also at time t3. In response to this, the average value output section 762 outputs the data on the average value calculated as described above as the monitoring data MO. These processes are performed sequentially from one pixel to another.

3.3 Data Transfer

Figure 22:
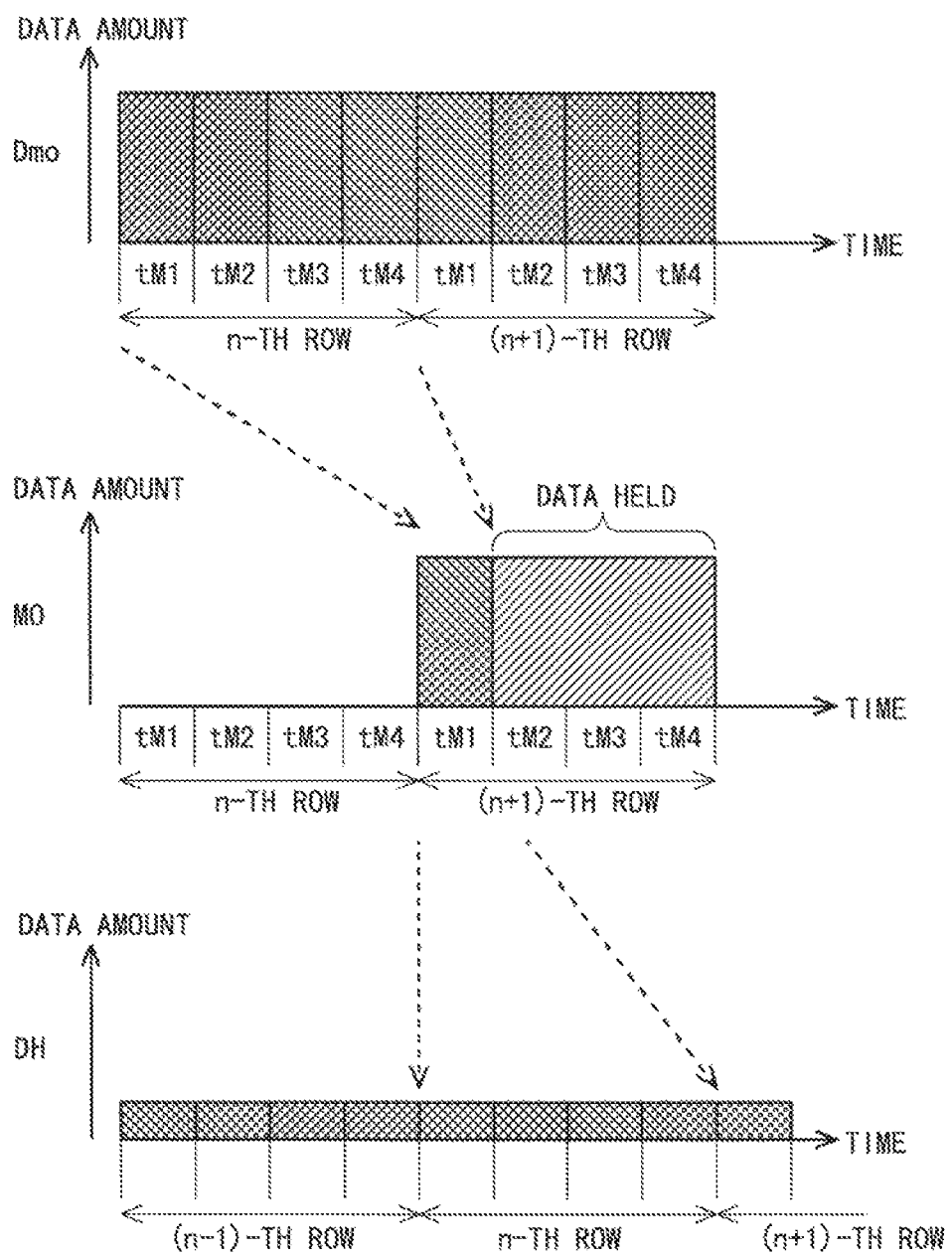
FIG. 22 is a diagram illustrating how the data obtained in current monitoring is transferred from a source driver to an image processing unit in a host in accordance with the third embodiment.
Figure 23:
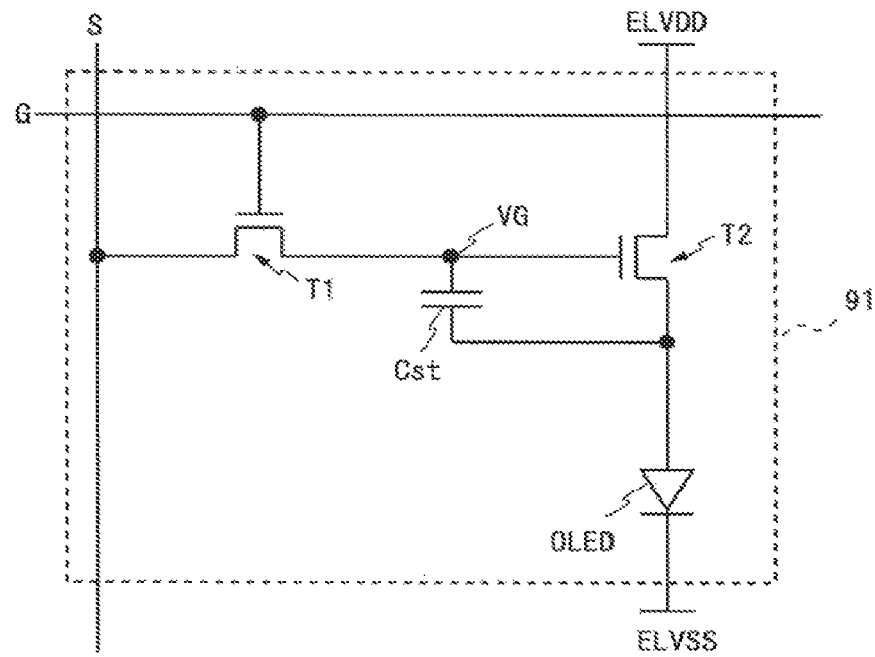
FIG. 23 is a circuit diagram of a configuration of a conventional, typical pixel circuit.
Figure 24:
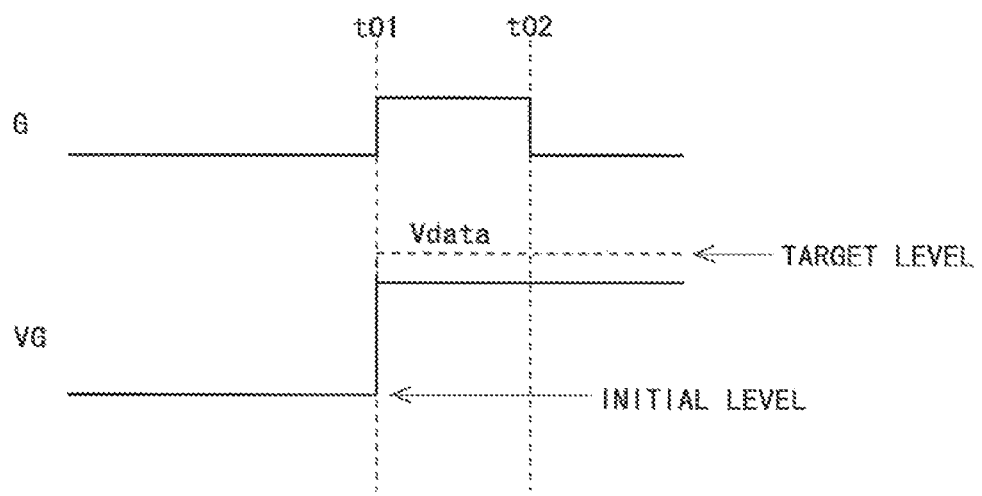
FIG. 24 is a timing chart depicting an operation of the pixel circuit shown in FIG. 23.

Next, referring to FIG. 22, it will be described how the data obtained in current monitoring is transferred from the source driver 30 to the image processing unit 50 in the host 5. In FIG. 22, tM1 to tM4 denote, for each pixel, timings at which the first- to fourth-round measured values Dmo are obtained respectively.

The AD converter 35 sends measured values (measured value data) Dmo to the averaging section 76 every time current monitoring is performed for one pixel. The averaging section 76 calculates an average value of the measured values Dmo obtained in four rounds of current monitoring through processes involving use of the flip-flops as mentioned earlier. Then, data on the average value for a pixel is supplied to the timing control unit 20 as the monitoring data MO when measured values for a next pixel are obtained. The timing control unit 20 performs time-axis expansion as described above. Note that since monitoring data MO for one pixel is supplied at a time to the timing control unit 20 in the present embodiment, there is no need to provide a dual port line memory that is capable of storing data for one line, to perform time-axis expansion. In this configuration, however, the monitoring data MO (m-bit data) is held for 4 clock periods. To lower the peak data amount, m/4 bits of the m-bit data is selected at a time, for example, starting from the highest-order bit and moving toward the lowest-order bit, and rearranged along the time axis on every clock pulse. This time-axis expansion by the timing control unit 20 lowers the peak value of the amount of the correction data DH outputted from the timing control unit 20 to the image processing unit 50 to one quarter the peak value of the amount of the monitoring data MO outputted from the source driver 30 to the timing control unit 20. In this manner, the present embodiment can also lower the peak value of the amount of data transferred between the timing control unit 20 and the image processing unit 50.

3.4 Effects

In the present embodiment, compensation computation is performed likewise using data on an average value. Therefore, when noise occurs during current monitoring, the noise has less influence on the compensation computation. Hence, similarly to the first embodiment, the present embodiment provides the organic EL display device 1 capable of suppressing influence of noise in detecting a current for compensation for degradation of a circuit element (e.g., the drive transistor T2 or the organic EL element OLED). In addition, since the total amount and peak value of data transfer from the timing control unit 20 to the host 5 can be lowered over conventional cases, desirable compensation computation can be performed based on results of current monitoring even when the data transfer bandwidth from the organic EL display device 1 to the image processing unit 50 is narrow, similarly to the first embodiment. Furthermore, since averaging and time-axis expansion are performed sequentially from one pixel to another according to the present embodiment, there is no need to provide a line memory. That allows for reduction in footprint of the chip and hence reduction in size of the display device.

4. Miscellaneous

The present invention is by no means limited to the embodiments and examples given above and may be practiced with various modifications without departing from the scope of the present invention. For example, the first and second embodiments employs a dual port line memory, which may be replaced with a multiport line memory having three or more ports.

REFERENCE SIGNS LIST

1 Organic EL Display Device
5 Host
10 Display Unit
11 Pixel Circuit
20 Timing Control Unit
22 Dual Port Line Memory
26,36,76 Averaging Section
27,37 Line Memory
28 Time-axis Expansion Section
30 Source Driver
35 AD Converter
39 Current/voltage Conversion Section
40 Gate Driver
50 Image Processing Unit
310 Data Line Drive Section
320 Current Monitoring Section
T1 to T3 Transistor
Cst Capacitor
OLED Organic EL Element
G1(1) to G1(N) Scan Line
G2(1) to G2(N) Monitoring Control Line
S(1) to S(M) Data Line
Imo Monitored Current
Vmo Monitored Voltage
Dmo Measured Value
Mo Monitoring Data
Amo Averaging Monitoring Data
DH Correction Data

The invention claimed is:

1. An active matrix display device comprising:
    a display unit comprising: a plurality of pixel circuits each including a circuit element, the pixel circuits forming a pixel matrix of rows and columns of pixels; scan lines each corresponding to a different one of the rows of the pixel matrix; and data lines each corresponding to a different one of the columns of the pixel matrix;
    a current measuring unit configured to measure a current flowing through the circuit element to output a measured value in accordance with the measured current;
    an average value calculation unit configured to calculate an average value of a plurality of input values; and
    a control circuit connected to an external device configured to perform compensation computation, the control circuit configured to control an operation of a scan line drive circuit that drives the scan lines and an operation of a data line drive circuit that drives the data lines,
    wherein:
    the current measuring unit measures a current flowing through the circuit element in each pixel circuit a plurality of times in a fixed amount of time; and
    the average value calculation unit, for each pixel circuit, receives a plurality of measured values outputted from the current measuring unit in the fixed amount of time as the plurality of input values, to output an average value of the plurality of measured values;
    the control circuit transmits, to the external device, the average value outputted from the average value calculation unit; and the control circuit transmits the average value to the external device at a lower data transfer rate than the average value calculation unit outputs the average value.

2. The display device according to claim 1, wherein:
the current measuring unit measures the current flowing through the circuit element row by row of the pixel matrix; and
the control circuit comprises a line memory having a plurality of ports, writes the average value outputted from the average value calculation unit into the line memory, and reads out the average value from the line memory at a lower rate than the average value is written thereinto and simultaneously transmits the readout data on the average value to the external device.

3. The display device according to claim 1, wherein the average value calculation unit is disposed in a data line drive circuit that drives the data lines.

4. The display device according to claim 1, wherein the average value calculation unit is disposed in a control circuit configured to control an operation of a scan line drive circuit that drives the scan lines and an operation of a data line drive circuit that drives the data lines.

5. The display device according to claim 1, wherein the average value calculation unit uses only those measured values which fall in a predetermined range of values, to calculate the average value.

6. The display device according to claim 1, wherein:
the current measuring unit measures the current flowing through the circuit element sequentially from one pixel circuit to another; and
the average value calculation unit comprises: (K−1) memory units for each pixel, the memory units configured to sequentially store the measured values outputted from the current measuring unit, where K is a number of times that the current measuring unit measures a current in the fixed amount of time; and an average value computation section configured to divide by K a total sum of one measured value outputted from the current measuring unit and (K−1) measured values outputted from the (K−1) memory units for each pixel.

7. The display device according to claim 1, wherein the average value calculation unit outputs the average value of the plurality of measured values as a value to be used in compensation computation to compensate for degradation of each circuit element.

* * * * *